US006583458B1

(12) United States Patent
Hayashi et al.

(10) Patent No.: US 6,583,458 B1
(45) Date of Patent: Jun. 24, 2003

(54) SEMICONDUCTOR INTEGRATED CIRCUIT INCLUDING A DRAM AND AN ANALOG CIRCUIT

(75) Inventors: Masao Hayashi, deceased, late of Kawasaki (JP); by Tadaaki Hayashi, legal representative, Komoro (JP); Taiji Ema, Kawasaki (JP); Narumi Ohkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/397,502

(22) Filed: Sep. 17, 1999

(30) Foreign Application Priority Data

Oct. 14, 1998 (JP) .......................... 10-292516
Feb. 19, 1999 (JP) .......................... 11-042291

(51) Int. Cl.[7] ...................... H01L 29/68; H01L 27/108
(52) U.S. Cl. ...................... 257/296; 257/306; 257/309
(58) Field of Search ................ 257/296–311, 905–908

(56) References Cited

U.S. PATENT DOCUMENTS 5,406,103 A * 4/1995 Ogawa .................... 257/306
5,945,702 A * 8/1999 Nakanishi ................ 257/296
6,020,644 A * 2/2000 Tanigawa ................. 257/775
6,124,622 A * 9/2000 Tsutsumi ................. 257/506
6,194,758 B1 * 2/2001 Tanaka et al. ............ 257/309

FOREIGN PATENT DOCUMENTS

| JP | 02177558 A | * | 7/1990 |
| JP | 4-348568 | | 12/1992 |
| JP | 6-104258 | | 4/1994 |
| JP | 7-235616 | | 9/1995 |

OTHER PUBLICATIONS

Rudolf E. Graf, Dictionary of Electronics, 1999, Reed Elsevier, 7th Ed. p. 96.*

* cited by examiner

*Primary Examiner*—Nathan J. Flynn
*Assistant Examiner*—Thomas L Dickey
(74) *Attorney, Agent, or Firm*—Armstrong Westerman & Hattori, LLP

(57) ABSTRACT

A semiconductor device includes an interlayer insulation film formed on a substrate so as to cover first and second regions defined on the substrate, and a capacitor formed over the interlayer insulation film in the first region, wherein the interlayer insulation film includes, in the first region, a stepped part defined by a groove having a bottom surface lower in level than a surface of the interlayer insulation film in the second region.

32 Claims, 34 Drawing Sheets

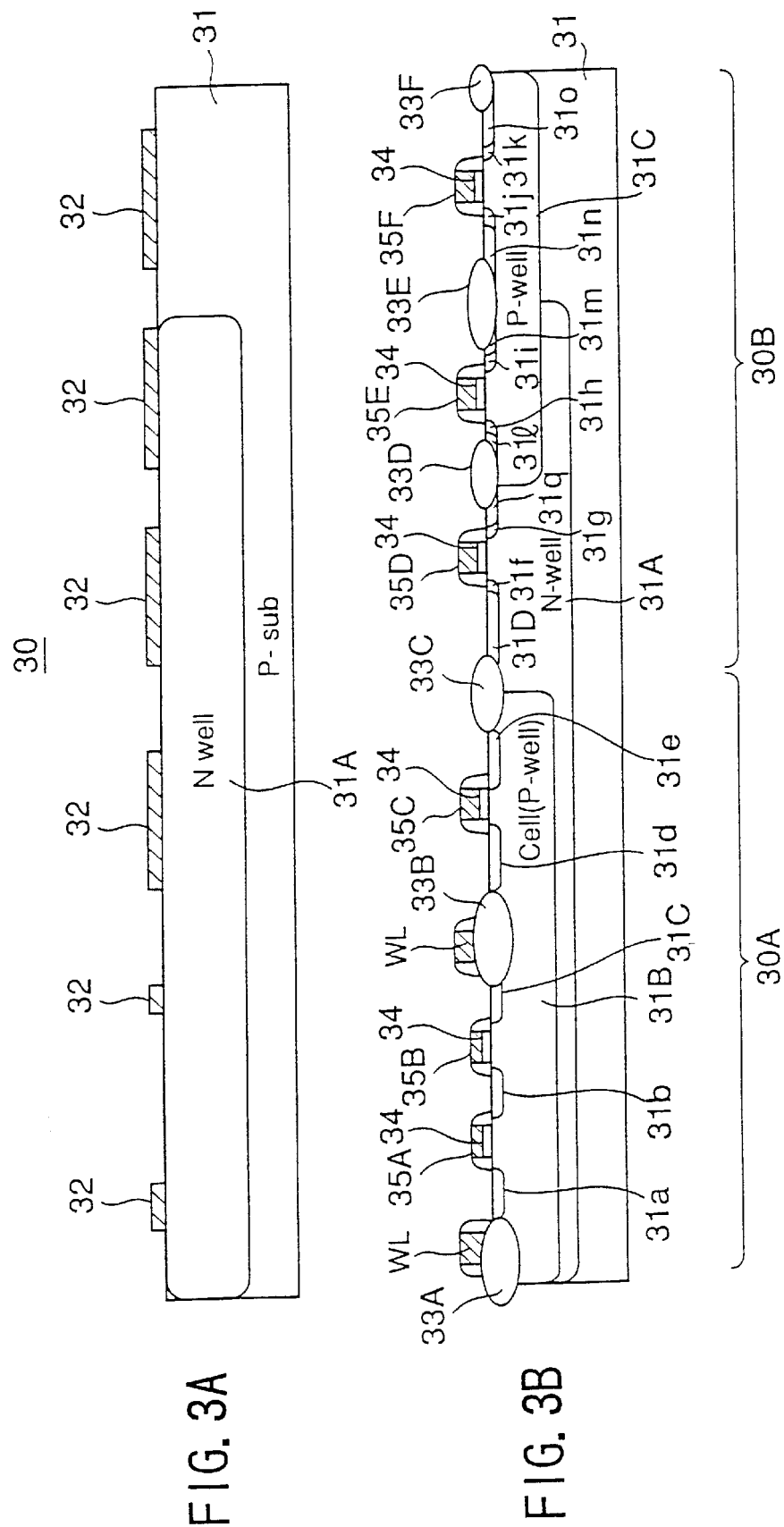

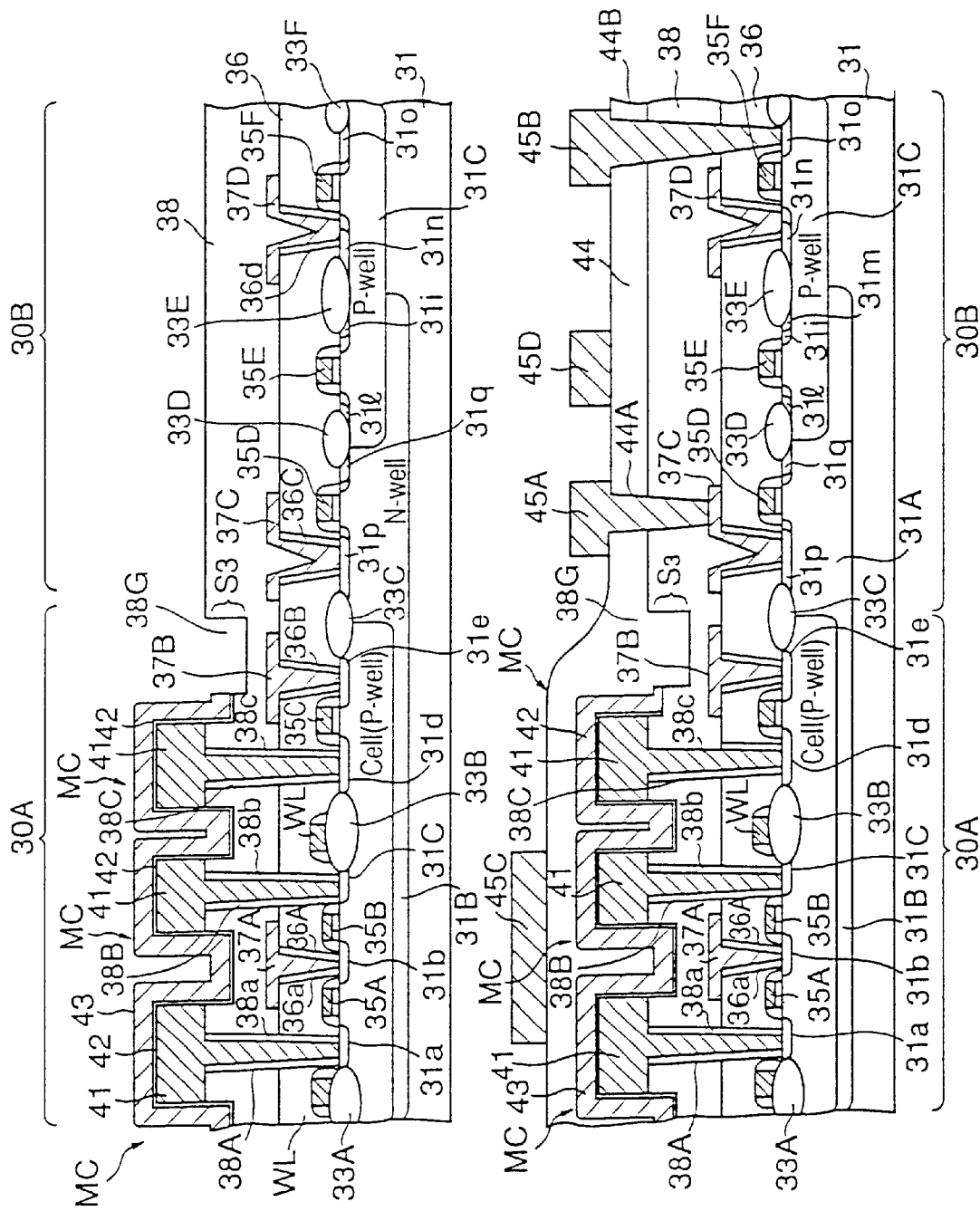

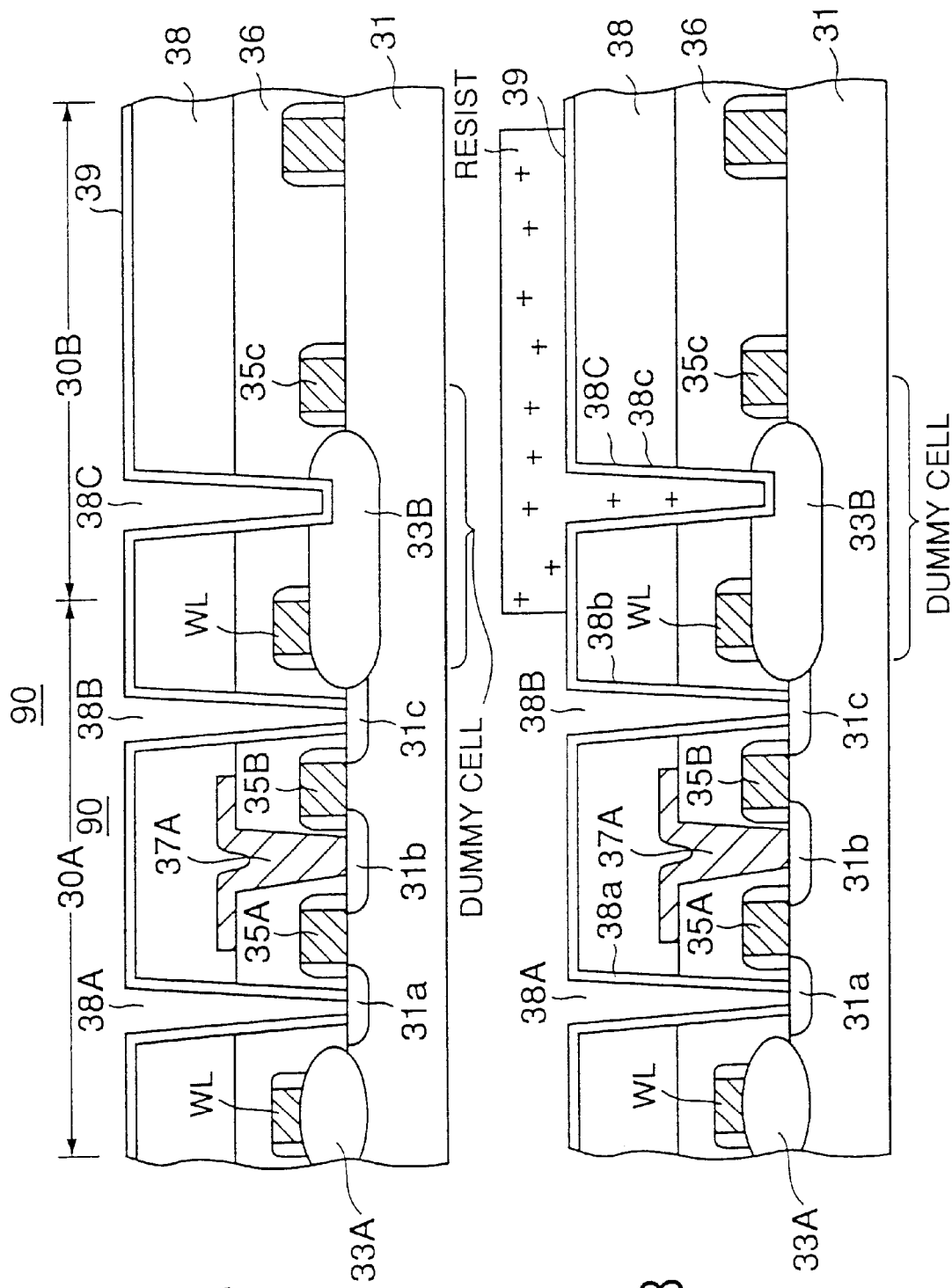

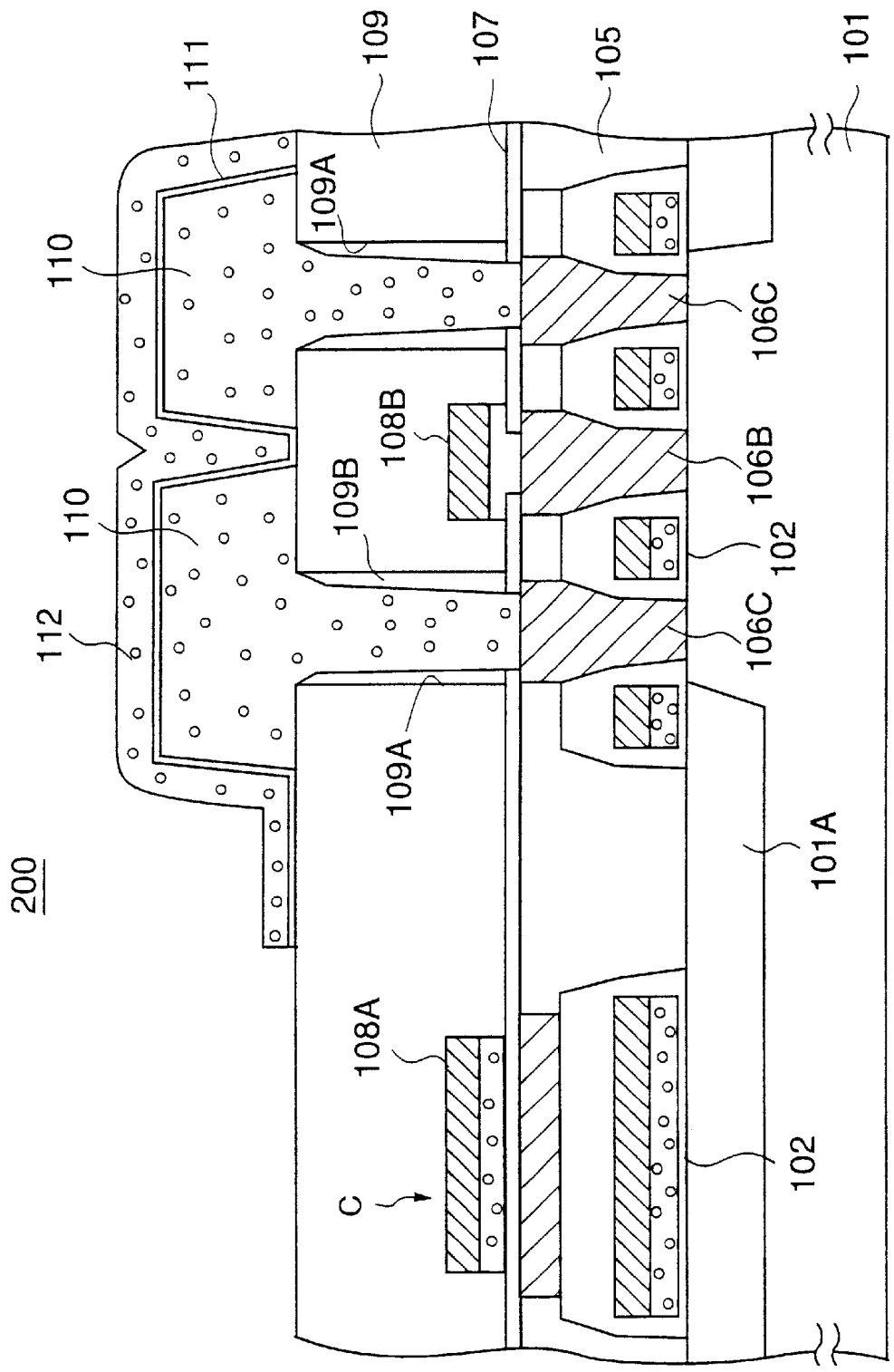

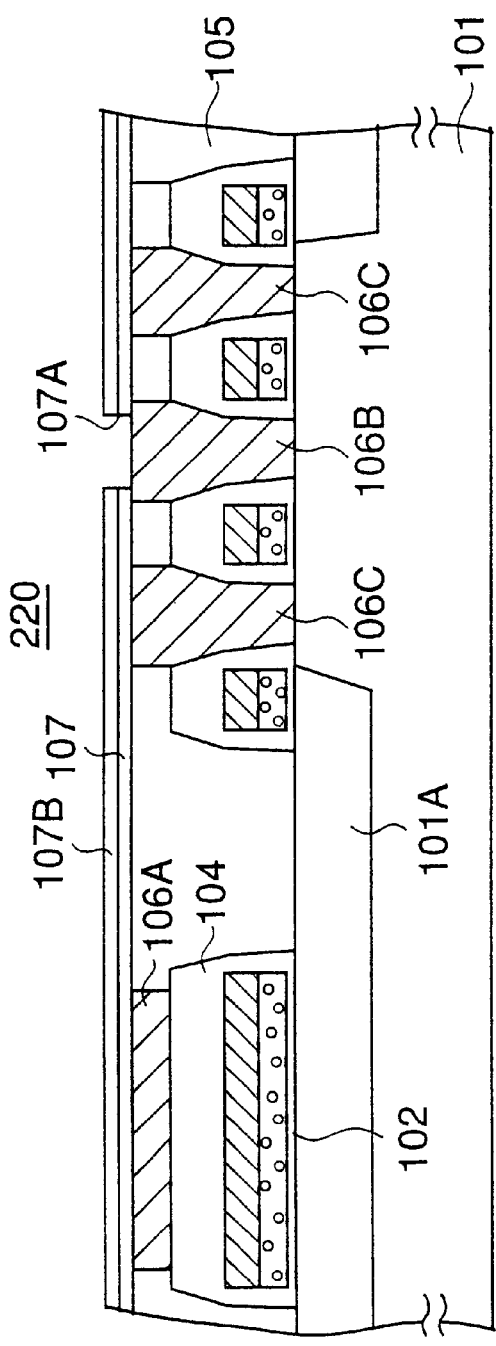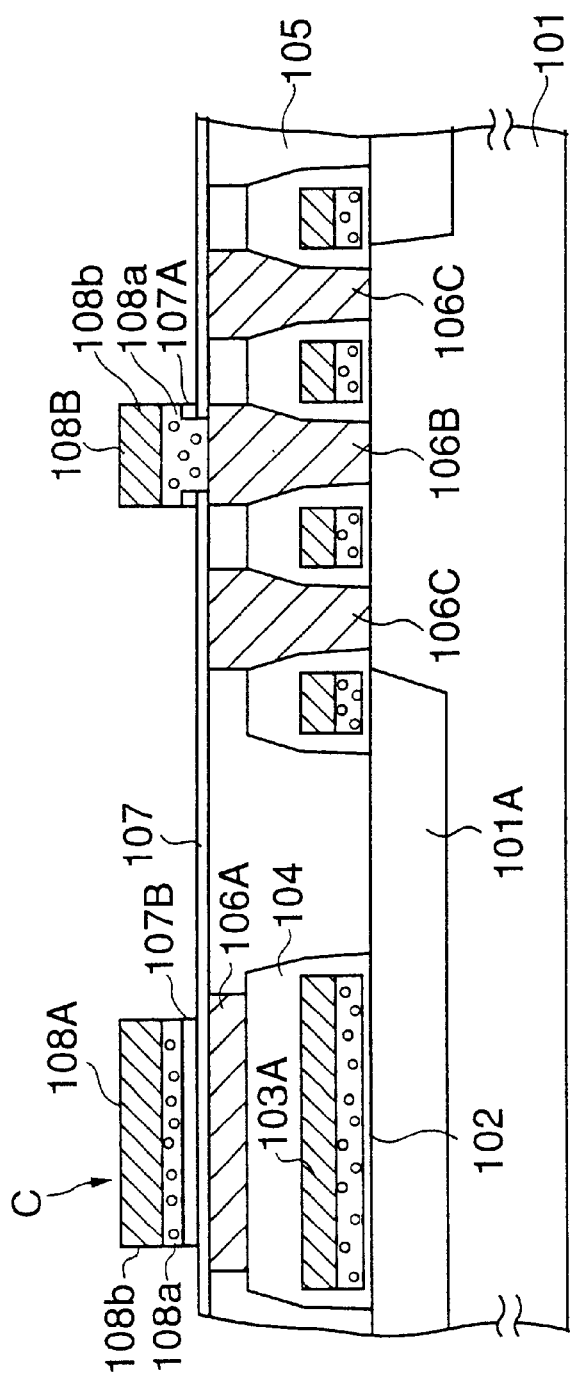
FIG.16A
FIG.16B

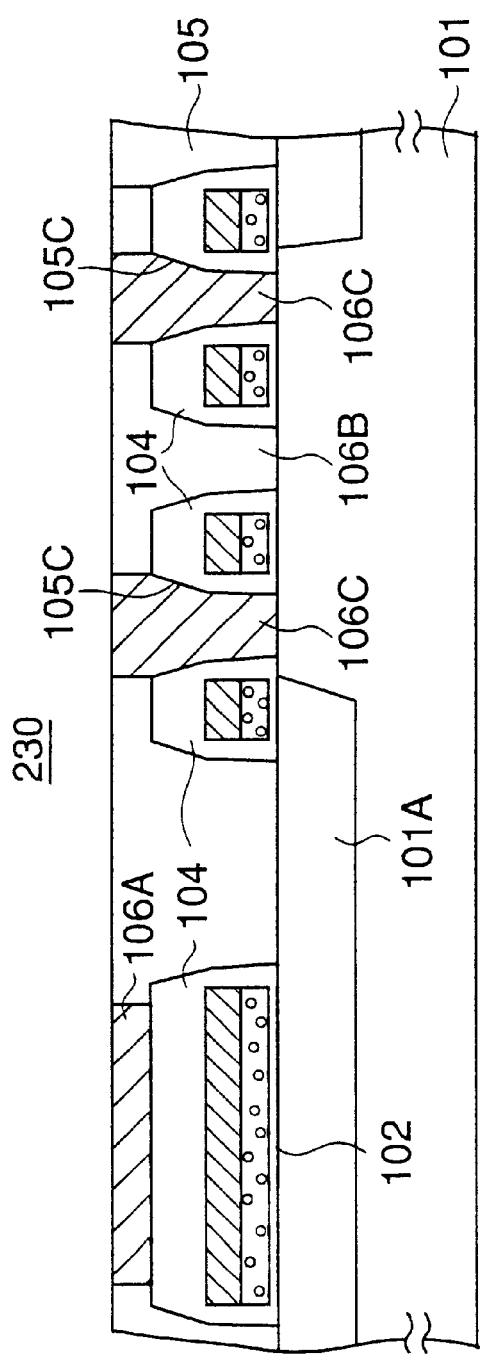
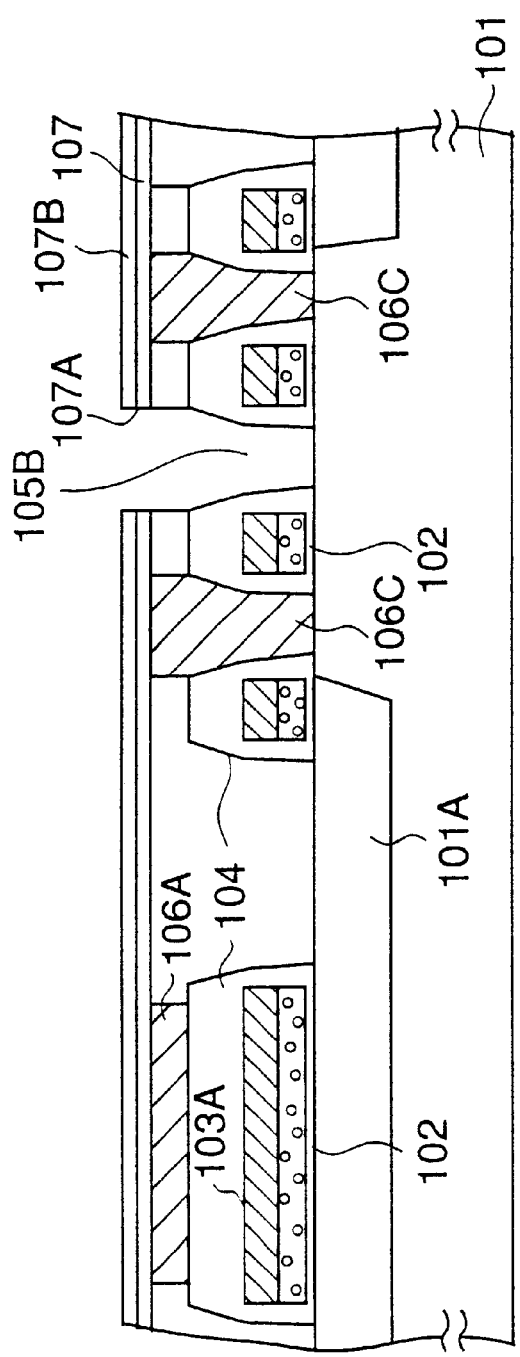
FIG.17A
FIG.17B

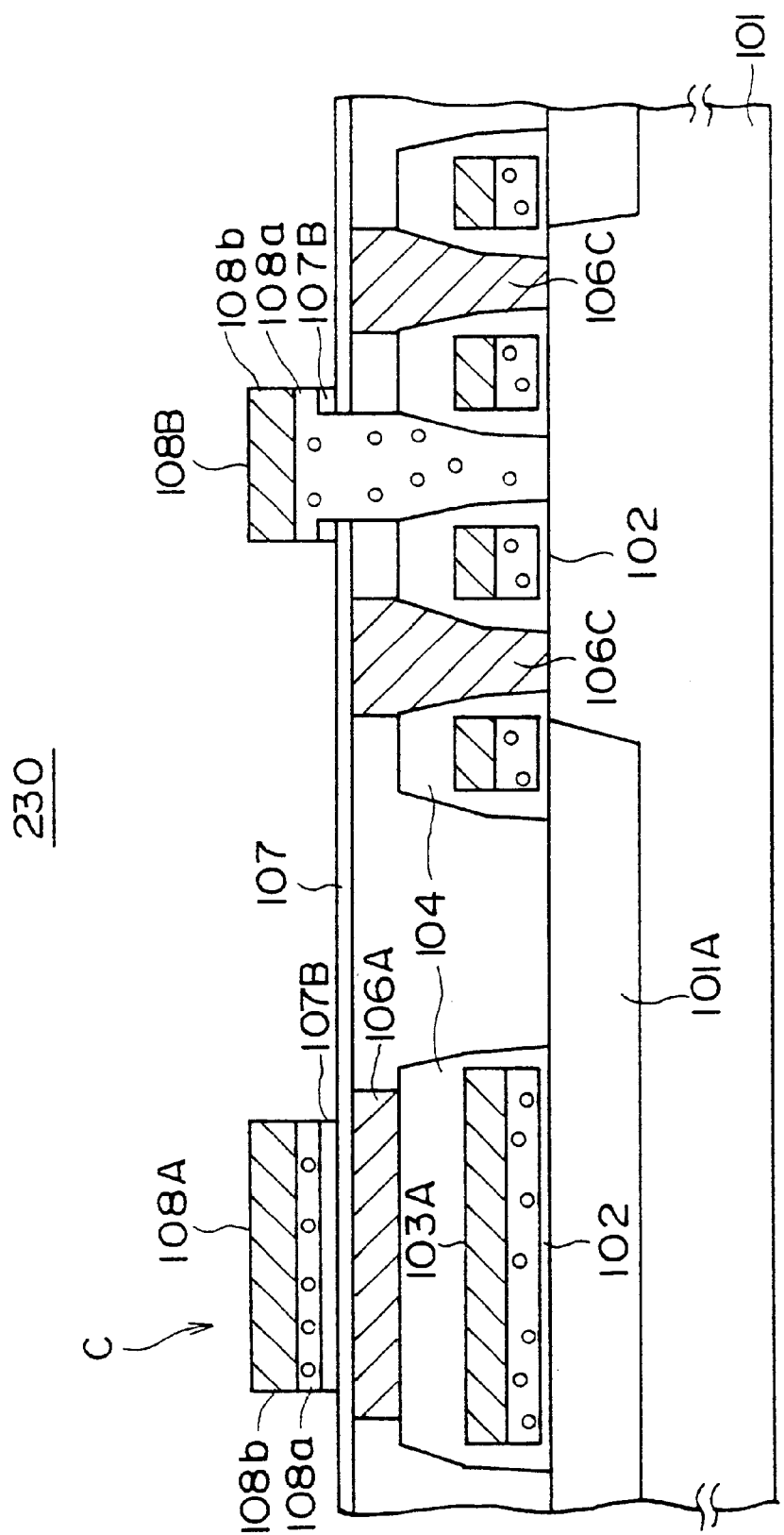

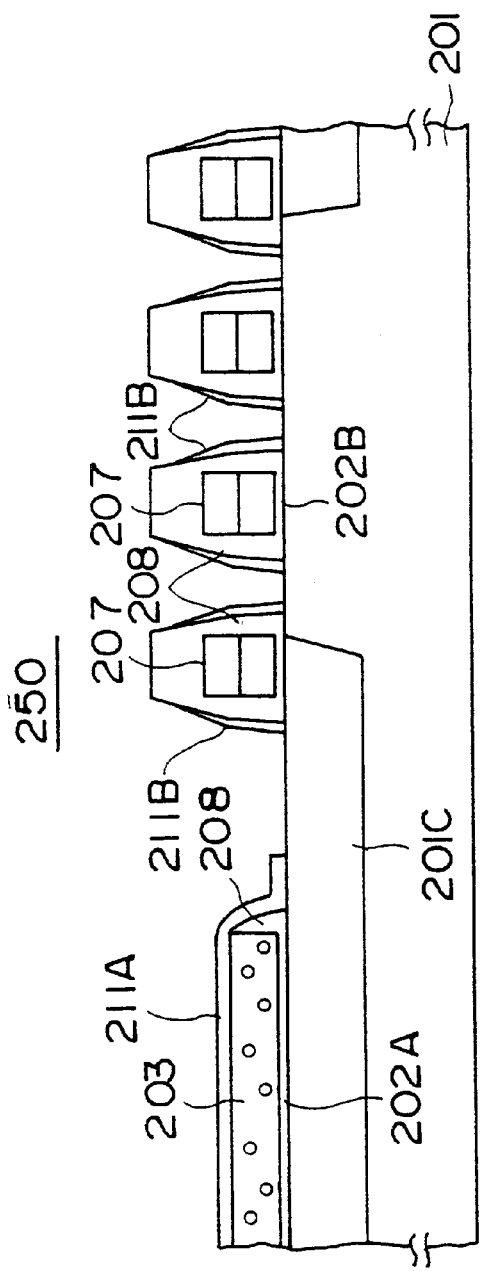
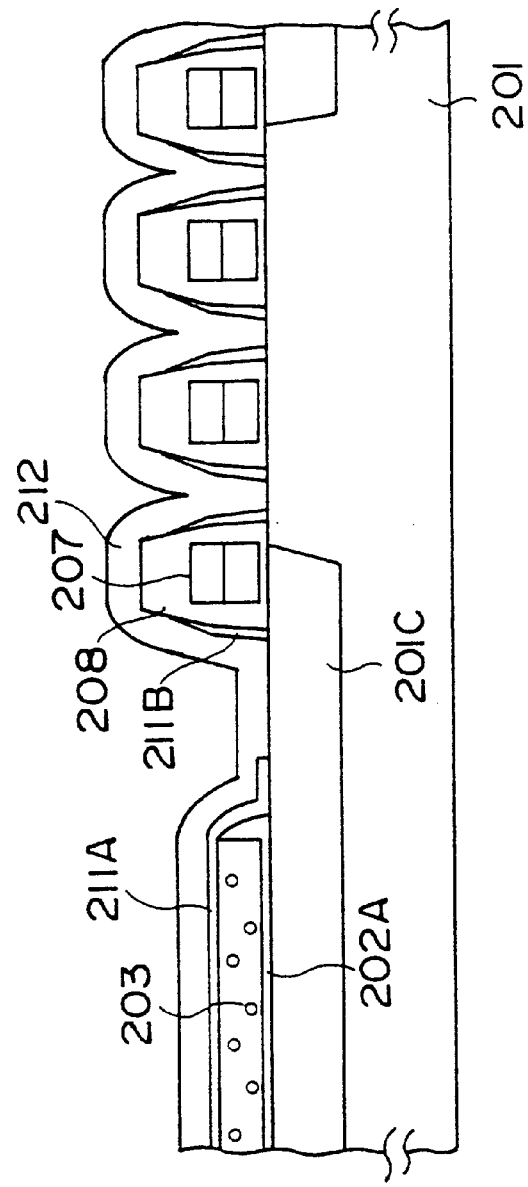
FIG.19A
FIG.19B

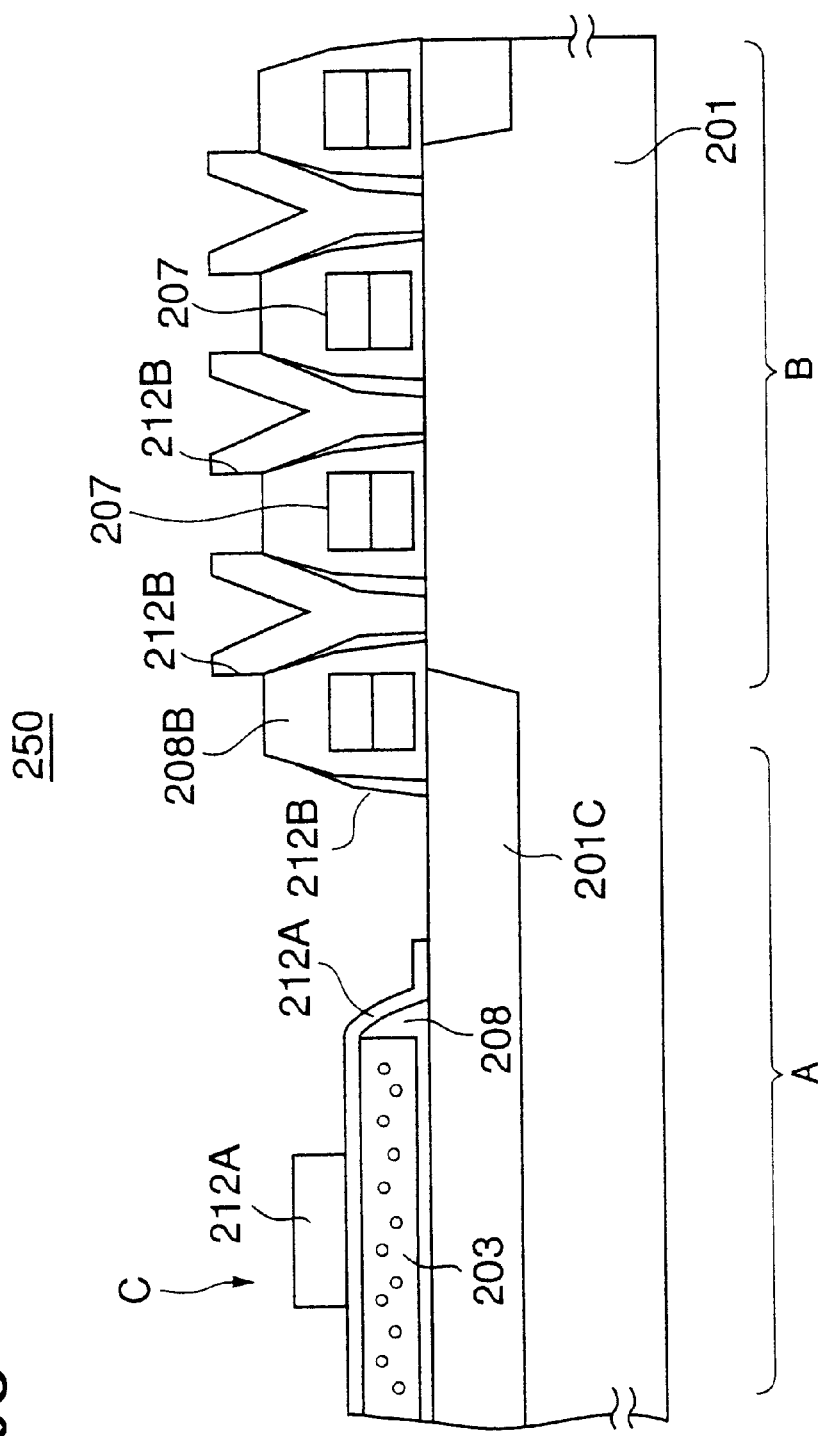

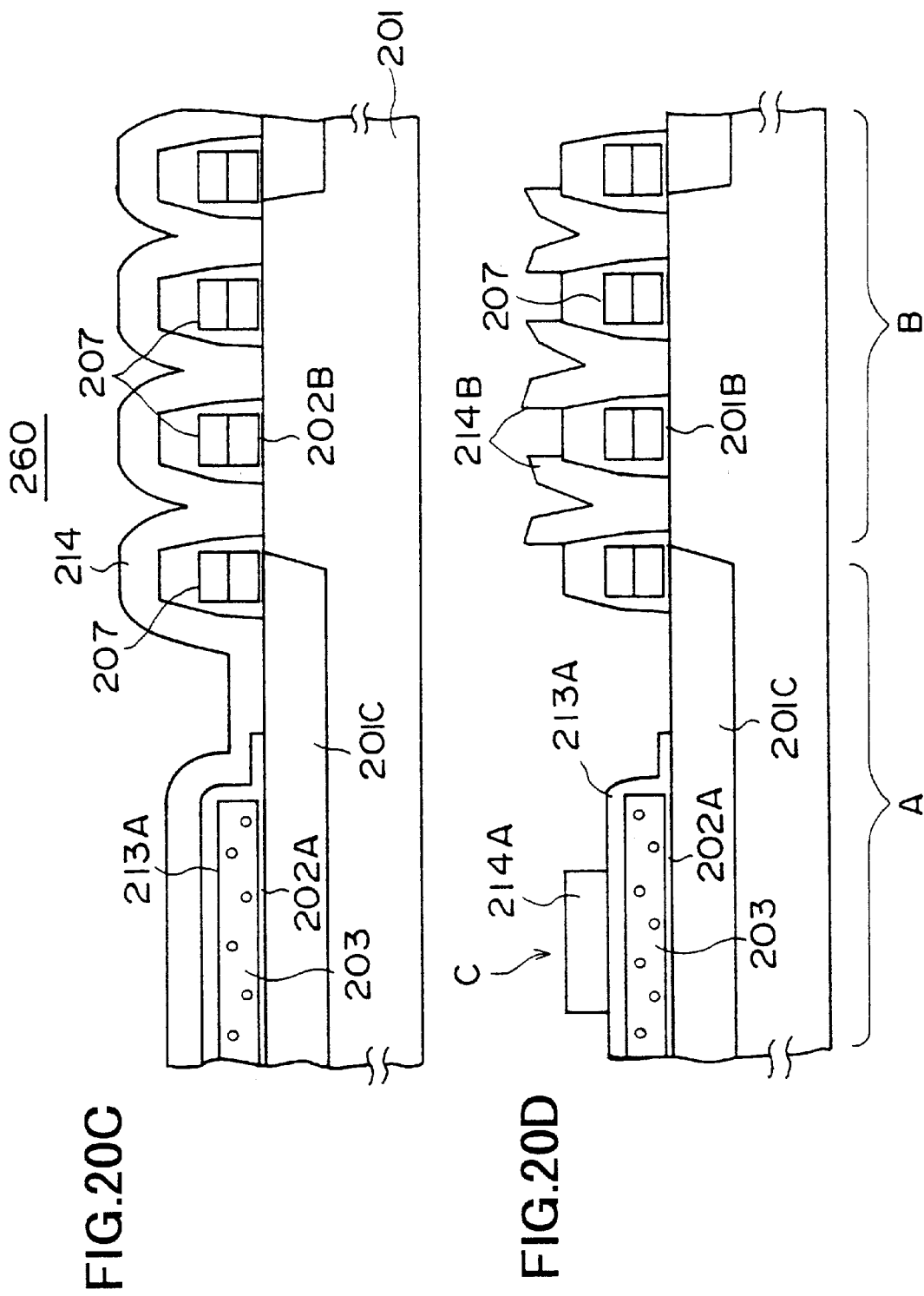

SEMICONDUCTOR INTEGRATED CIRCUIT INCLUDING A DRAM AND AN ANALOG CIRCUIT

BACKGROUND OF THE INVENTION

The present invention generally relates to semiconductor devices and more particularly to a semiconductor device having a capacitor and a fabrication process thereof.

A DRAM is a high-speed semiconductor memory device that stores information in a capacitor formed therein monolithically in the form of electric charges. Thus, DRAMs are used extensively in information processing apparatuses such as a computer as a memory device.

In these days, there is a demand for a semiconductor device in which a DRAM and an analog circuit device are formed monolithically on a common semiconductor substrate. Such an analog circuit device generally includes a capacitor formed in the monolithic state.

FIG. 1 shows the construction of a conventional DRAM 10.

Referring to FIG. 1, the DRAM 10 is formed on a Si substrate 11 on which a memory cell region 10A and a peripheral region 10B are formed, wherein each of the memory cell region 10A and the peripheral region 10B includes an active region defined by a field oxide film 12. Further, in the active region defined in the cell region 10A by the field oxide film 12, there are formed polysilicon gate electrodes 13A–13C on respective gate oxide films 13a–13c as word lines WL. In the substrate 11, there are formed diffusion regions 11a–11e adjacent to the gate electrodes 13A–13C as represented in FIG. 1, wherein each of the gate electrodes 13A–13C carries a pair of side wall insulation films. This side wall insulation film may be omitted.

Similarly, there is formed a gate electrode 13D in the peripheral region 10B via a gate insulation film 13d, and diffusion regions 11f and 11g are formed in the substrate 11 adjacent to the gate electrode 13D. Further, there is formed a high-concentration diffusion region 11h in the peripheral region 10B in correspondence to a region isolated by the field oxide film 12, and there is formed a capacitor electrode 13E on the foregoing high-concentration diffusion region 11h via an intervening insulation film 13e. It should be noted that the insulation film 13e corresponds to the gate insulation film 13d, of the gate electrode 13D. As a result, the insulation film 13e form, together with the capacitor electrode 13E and the diffusion region 11h, a capacitor C of the analog circuit device that is formed in the peripheral region 10B.

It should be noted that the gate electrodes 13A–13D, the word line WL, and further the capacitor electrode 13E are covered by a first interlayer insulation film 14 formed on the substrate 11 so as to continuously cover the foregoing regions 10A and 10B, and contact holes 14A–14C are formed in the interlayer insulation film 14 so as to expose the diffusion regions 11b, 11d and 11f respectively. It should be noted that the contact holes 14A–14C have respective side walls covered by side wall insulation films 14a–14c, and bit line electrodes 15A and 15B are provided on the interlayer insulation film 14 so as to cover the contact holes 14A and 14B. Further, an electrode 15C is formed on the interlayer insulation film 14 so as to cover the contact hole 14C. Thereby, the side wall insulation film 14a prevents the short-circuit between the electrode 15A and the electrode 13A in the case the position of the contact hole 14A is offset. The side wall insulation films 14b and 14c function similarly.

Further, the electrodes 15A–15C are covered by a second interlayer insulation film 16 formed on the interlayer insulation film 14, and contact holes 16A and 16B are formed in the interlayer insulation film 16 so as to expose the diffusion regions 11a and 11c in the memory cell region 10A. The contact holes 16A and 16B are formed with respective side wall insulation films 16a and 16b, and polysilicon accumulation electrodes 17A and 17B are formed on the interlayer insulation film 16 so as to cover the contact holes 16A and 16B respectively. Thereby, the side wall insulation films 16a and 16b prevent the short-circuit between the accumulation electrode 17A or 17B with the adjacent gate electrode 13A or 13B.

In the memory cell region 10A, it should be noted that the accumulation electrodes 17A and 17B are covered by a dielectric film 18, and the dielectric film 18 in turn is covered by a polysilicon opposing electrode 19. Further, the polysilicon opposing electrode 19 is covered with a third interlayer insulation film 20 that covers also the foregoing peripheral region 10B continuously, and a contact hole 20A and a contact hole 20B are formed in the interlayer insulation film 20 such that the contact hole 20A exposes the electrode 15C and such that the contact hole 20B exposes the electrode 13E. Further, electrodes 21A and 21B are formed on the interlayer insulation film 20 respectively in correspondence to the contact holes 20A and 20B. Further, interconnection patterns 21C and 21D are formed on the interlayer insulation film 20. Thereby, the accumulation electrodes 17A and 17B form, together with the dielectric film 18 thereon and the opposing electrode 19, respective memory cell capacitors.

The DRAM 10 of FIG. 1, however, has suffered from a drawback in that there tends to appear a large step height between the memory cell region 10A and the peripheral region 10B as a result of the repeated etching processes for forming the memory cell capacitors in the memory cell region 10A. Further, such a stepped part at the boundary of the memory cell region 10A and the peripheral region 10B tends to invite accumulation of irregular polysilicon residue, which may cause various unpreferable effects such as short-circuit.

SUMMARY OF THE INVENTION

Accordingly, it is a general object of the present invention to provide a novel and useful semiconductor device and a fabrication process thereof wherein the foregoing problems are eliminated.

Another and more specific object of the present invention is to provide a semiconductor device including a memory cell region, in which a memory cell capacitor is formed, and a peripheral region where no such a memory cell capacitor is formed, wherein the step between the memory cell region and the peripheral region is minimized.

Another object of the present invention is to provide a semiconductor device including a memory cell region, in which a memory cell capacitor is formed, and a peripheral region where no such a memory cell capacitor is formed, wherein the problem of irregular polysilicon pattern remaining at a stepped part formed between the memory cell region and the peripheral region is effectively eliminated.

Another object of the present invention is to provide a fabrication process of a semiconductor device that includes a memory cell region, in which a memory cell capacitor is formed, and a peripheral region where no such a memory cell capacitor is formed, wherein a capacitor is formed in the peripheral region without increasing the number of the mask steps.

Another object of the present invention is to provide a semiconductor device, comprising:

a substrate defined thereon a first region and a second region;

an interlayer insulation film formed on said substrate so as to cover said first and second regions; and a capacitor formed on said interlayer insulation film in said first region; and wherein said interlayer insulation film includes, in said first region, a stepped part defined by a groove having a bottom surface lower in level than a surface of said interlayer insulation film in said second region.

According to the present invention, the problem of etching of the second region, which tends to occur in the semiconductor device that has the first region, or memory cell region, including therein a capacitor and further the second region or a peripheral region, when patterning the capacitor in the first region, is successfully avoided by protecting the second region by a mask process during the foregoing patterning process of the capacitor. As a result, the height of the stepped part formed between the first region and the second region, which otherwise would be formed with a substantial step height, is successfully minimized. Further, by covering the stepped part between the first region and the second region by a conductive pattern, the problem associated with the formation of conductive residue at such a stepped part such as peeling and scattering of the conductive residue is effectively avoided. Further, by forming the capacitor insulation film concurrently with the side wall insulation film of the contact hole formed in the memory cell region, it becomes possible to form a large-capacitance capacitor without increasing the area of the semiconductor device or increasing the number of the mask steps. Further, by forming a dummy memory cell capacitor in the marginal part of the memory cell region such that the edge part of the storage capacitor covers, on the field oxide film, an insulation film identical with the insulation film forming a side wall insulation film of the contact holes for other memory cell capacitors, the problem of unnecessary increase in the area associated with the formation of the dummy memory cell is effectively avoided.

Another object of the present invention is to provide a semiconductor device, comprising:

a substrate;

a first conductive layer formed on said substrate;

an interlayer insulation film formed on said substrate so as to cover said first conductor layer;

a contact hole formed in said interlayer insulation film so as to expose said substrate;

a side wall insulation film covering a side wall of said contact hole;

a conductive side wall film covering a side wall of said side wall insulation film; and a second conductive layer covering said conductive side wall film in said contact hole, said second conductive layer making an electrical contact with a surface of said substrate.

According to the present invention, it becomes possible, in a semiconductor device in which an analog circuit device having a capacitor and another semiconductor circuit are formed monolithically on a common substrate, to eliminate the problem of pinhole formation in a side wall insulation film that protects a side wall of a contact hole, even in such a case in which a native oxide film is removed from the surface of the substrate exposed by the contact hole by applying a wet etching process using HF, and the like, by providing a conductive layer on the side wall insulation film covering the side wall of the contact hole. The present invention is particularly useful when forming the capacitor in the analog circuit device concurrently with the side wall insulation film, as the conductive layer effectively protects the capacitor insulation film. Thereby, the problem of thinning of the capacitor insulation film or formation of pinhole in the capacitor insulation film is positively eliminated. As the capacitor insulation film and the side wall insulation film of the contact hole are formed simultaneously by the common process, and as the conductor layer on the side wall insulation film and the conductor layer protecting the capacitor insulation film are formed simultaneously by the common process, there occurs no increase in the number of the mask steps.

Another object of the present invention is to provide a semiconductor integrated circuit, comprising:

a substrate;

a first semiconductor device formed on a first region of said substrate;

a second semiconductor device formed on a second region of said substrate;

an interlayer insulation film formed on said substrate;

a first opening formed in a part of said interlayer insulation film covering said first region;

a first electrode covering said first opening;

a second opening formed in a part of said interlayer insulation film covering said second region so as to expose a surface of said substrate;

a second electrode covering said second opening;

an insulation film covering said interlayer insulation film; and a third electrode formed on said insulation film in correspondence to said first electrode so as to sandwich said insulation film between said first electrode and said third electrode;

said first electrode and said second electrode having a substantially identical composition.

According to the present invention, it becomes possible to form, in a semiconductor integrated circuit in which two or more, different semiconductor circuits such as a DRAM and an analog circuit are formed, the capacitor of the analog circuit and the bit line contact or bit line pattern of the DRAM without increasing the number of the mask steps.

Other objects and further features of the present invention will become apparent from the following detailed description when read in conjunction with the attached drawings.

BRIEF DESCRIPTION OF THE DRAWINGS

FIGS. 3A–3F are diagrams showing the fabrication process of a semiconductor device according to a second embodiment of the present invention;

FIGS. 13A–13C are diagrams showing the construction of a semiconductor device according to a sixth embodiment of the present invention;

FIGS. 15A–15D are diagrams showing the construction of a semiconductor device according to an eighth embodiment of the present invention;

FIGS. 16A and 16B are diagrams showing the construction of a semiconductor device according to a ninth embodiment of the present invention;

FIGS. 17A–17C are diagrams showing the construction of a semiconductor device according to a tenth embodiment of the present invention;

FIGS. 19A–19C are diagrams showing the construction of a semiconductor device according to a twelfth embodiment of the present invention;

FIGS. 20A–20D are diagrams showing the construction of a semiconductor device according to a thirteenth embodiment of the present invention;

DETAILED DESCRIPTION OF THE PREFERRED EMBODIMENTS

First Embodiment

Figure 1:
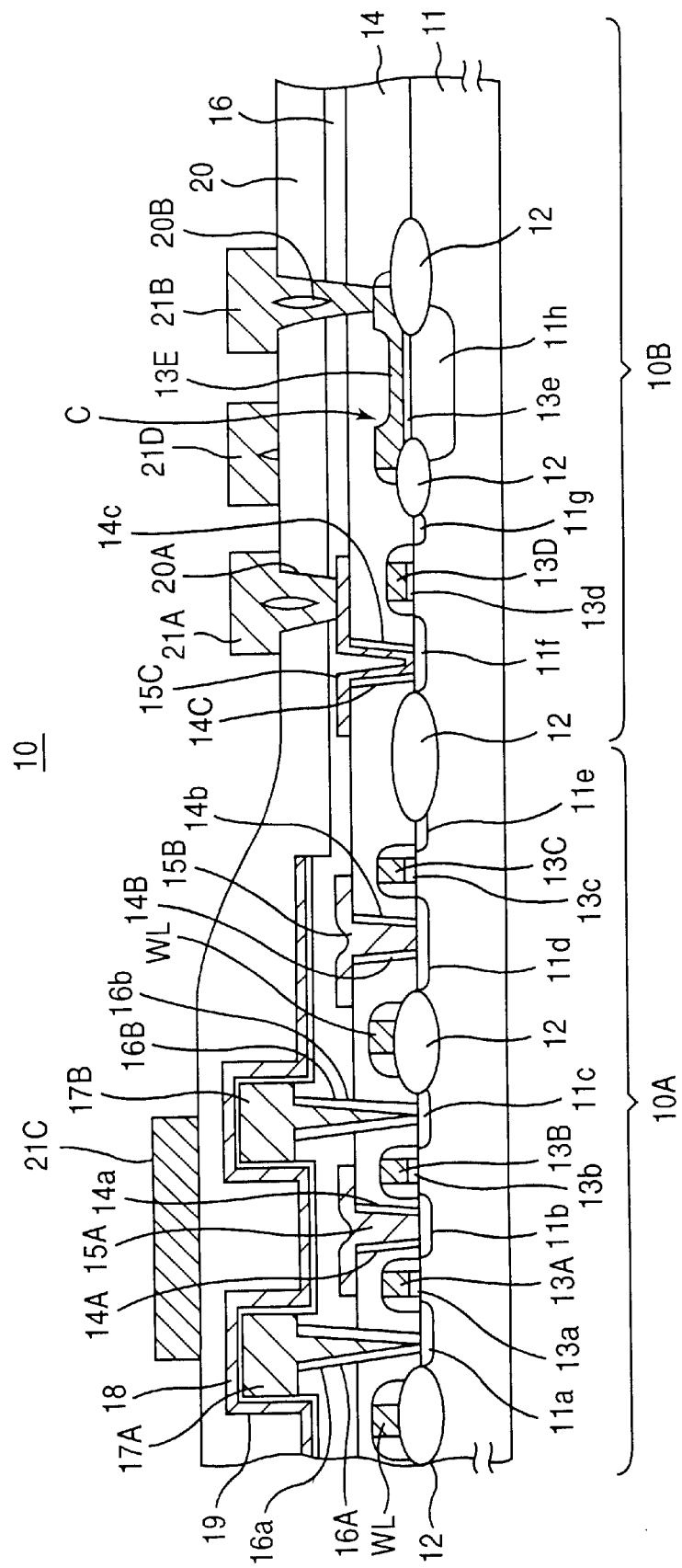
FIG. 1 is a diagram showing the construction of a conventional DRAM.
Figure 2A:
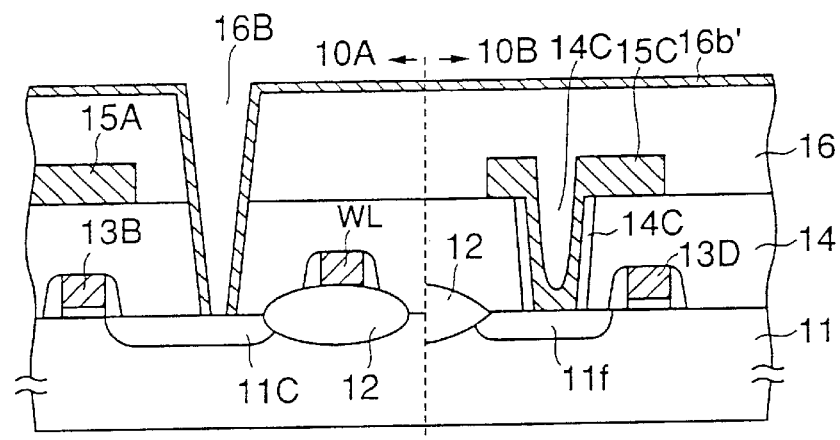
FIGS. 2A–2C are diagrams showing the fabrication process of the DRAM of FIG. 1 according to a first embodiment of the present invention.
Figure 2B:
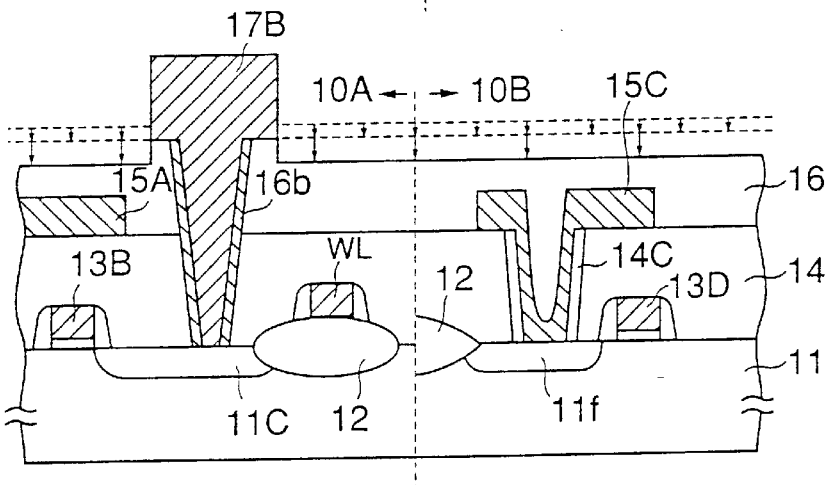
Figure 2C:
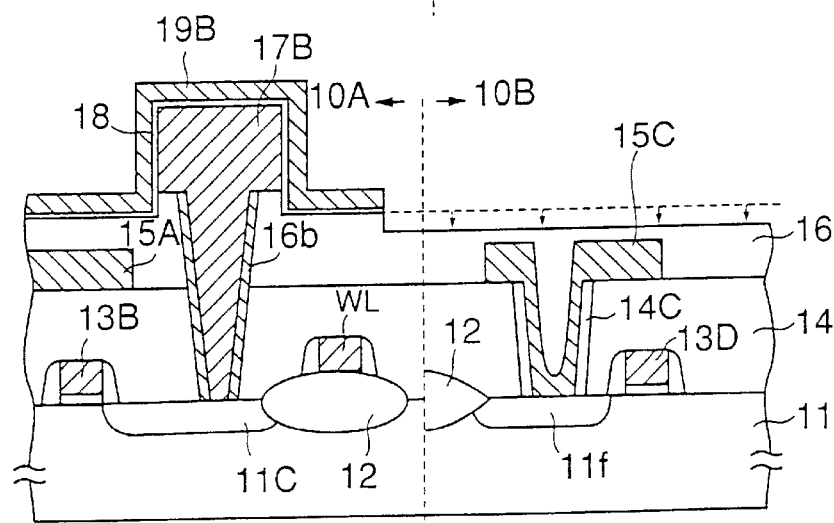

FIGS. 2A–2C show the process of forming the memory cell capacitor in the semiconductor device of FIG. 1 according to a first embodiment of the present invention, wherein those parts corresponding to the parts described previously are designated by the same reference numerals and the description thereof will be omitted.

Referring to FIG. 2A, the contact hole 16B is formed in the second interlayer insulation film 16 so as to expose the diffusion region 11c, and an insulation film 16' is deposited on the interlayer insulation film 16 so as to cover the side wall of the contact hole 16B. Next, in the step of FIG. 2B, an anisotropic etching process acting substantially perpendicularly to the principal surface of the substrate 11 is applied on the insulation film 16', and the side wall insulation film 16b is formed by removing the insulation film 16' remaining on the interlayer insulation film 16.

Next, in the step of FIG. 2B, a polysilicon film is deposited on the interlayer insulation film 16 so as to cover the contact hole 16B, followed by a patterning process using a resist pattern to form the foregoing accumulation electrode 17B.

Further, in the step of FIG. 2C, the dielectric film 18 and a polysilicon film constituting the opposing electrode 19 are deposited consecutively, followed by a patterning process using a resist pattern to form the memory cell capacitor.

In the step of FIGS. 2A–2C, it should be noted that there are two dry etching processes conducted in the step of FIG. 2B and another dry etching process in the step of FIG. 2C. Thereby, in view of the finite, or non-ideal selectivity of the dry etching process, there inevitably is caused a formation of a step at the edge part of the accumulation electrode 17B and at the edge part of the opposing electrode 19. Thus, in view of the total, or accumulated step height of these steps, there can be a case in which the level of the top surface of the interlayer insulation film 16 becomes substantially lower than the initial level thereof. Thereby, a large step is formed also on the surface of the interlayer insulation film 20 in correspondence to the boundary between the memory cell region 10A and the peripheral region 10B. Further, as a result of the etching of the surface of the interlayer insulation film 16, there can be case in which the electrode formed on the interlayer insulation film 14 may be exposed in the peripheral region 10B.

Second Embodiment

FIGS. 3A–3F show the fabrication process of a DRAM according to a second embodiment of the present invention wherein the problems of the first embodiment is eliminated.

Referring to FIG. 3A, a p-type Si substrate 31 is formed with an n-type well 31A and an initial oxide film (not shown) is formed on the substrate with a thickness of about 3 nm. Further, an SiN pattern 32 is formed thereon with a thickness of about 115 nm, such that the SiN pattern 32 defines a device isolation region.

Next, in the step of FIG. 3B, field oxide films 33A–33F are formed on the substrate 31 by a wet oxidation process with a thickness of about 320 nm while using the SiN pattern 32 as a mask. Further, a p-type well 31A is formed in the n-type well 31A in correspondence to the memory cell region 30A by conducting an ion implantation process of B$^+$. Further, there is formed a p-type well 31C in the substrate 31 in correspondence to a peripheral region 30B formed outside the p-type well 31B, such that the p-type well 31C extends from the peripheral region 31B into memory cell region 31A and includes the p-type well 31B formed in the memory cell region 30A. In the actual process of forming the foregoing wells, the p-type well 31C may be formed first, followed by the step of forming the n-type well 31B. The n-type well 31A may be formed by an ion implantation process conducted after the formation of the field oxide films.

Next, in the step of FIG. 3B, a gate oxide film 34 is formed on the surface of the substrate 31 with a thickness of about 8 nm, and an amorphous silicon layer doped with P is formed further on the gate oxide film 34 by a thermal CVD process with a thickness of about 160 nm. By patterning the amorphous silicon layer by a photolithographic process, gate electrodes 35A–35F are formed on the substrate 31. Thereby, each of the gate electrodes 35A–35F constitutes a part of the word line WL, as is well known in the art. Further, the field oxide films 33A and 33B in the memory cell region 30A carries thereon the word lines WL of different memory cell regions.

Further, an ion implantation process of P$^+$ is conducted into the memory cell region 30A of the Si substrate 31 while using the gate electrodes 35A–35F as a mask, to form diffusion regions 31a–31d of the n$^-$-type such that the diffusion regions 31a–35d are located adjacent to the gate electrodes 35A–35C. Simultaneously to the formation of the foregoing diffusion regions 31a–31d, diffusion regions 31h–31k of the n$^-$-type are formed in the peripheral region 30B adjacent to the gate electrodes 35E and 35F, wherein the diffusion regions 31h–31k of the n$^-$-type constitute an LDD region of the transistor to be formed in the peripheral region 30B. Further, diffusion regions 31f and 31g of the n$^-$-type are formed also in the n-type well 31A of the peripheral region 30B adjacent to the gate electrode 35D.

Next, the memory cell region 30A and the p-type well 31C are protected by a resist pattern and an ion implantation of B$^+$ is conducted into the exposed n-type well region 31A of the peripheral region 30B while using the gate electrode 35D as a mask, and the conductivity type of the foregoing diffusion regions 31f and 31g is changed from the n$^-$-type to the p$^-$-type.

Further, the gate electrodes 35A–35F are covered by an oxide film, followed by an etch-back process, to form a side wall oxide film on each of the gate electrodes 35A–35F.

Next, in the step of FIG. 3B, the memory cell region 30A and the n-type well 31A of the peripheral region 30B are covered by a resist pattern, and diffusion regions 31l–31o of the n$^+$-type are formed in the substrate 31 adjacent to the electrodes 35E and 35F at the location outside the side wall oxide film thereon, by conducting an ion implantation process of As$^+$ while using the gate electrodes 35E and 35F and the side wall oxide films thereon as a self-aligned mask.

In the step of FIG. 3B, the substrate 31 is further covered by a resist pattern such that the n-type well 31A of the peripheral region 30B is exposed, and an ion implantation process of BF$_2^+$ is conducted into the substrate 31 while using the gate electrode 35D and the side wall oxide films thereon as a self-aligned mask, to form diffusion regions 31p and 31q of the p$^+$-type adjacent to the gate electrode at the location outside the side wall oxide films.

Figures 3C, 3D:
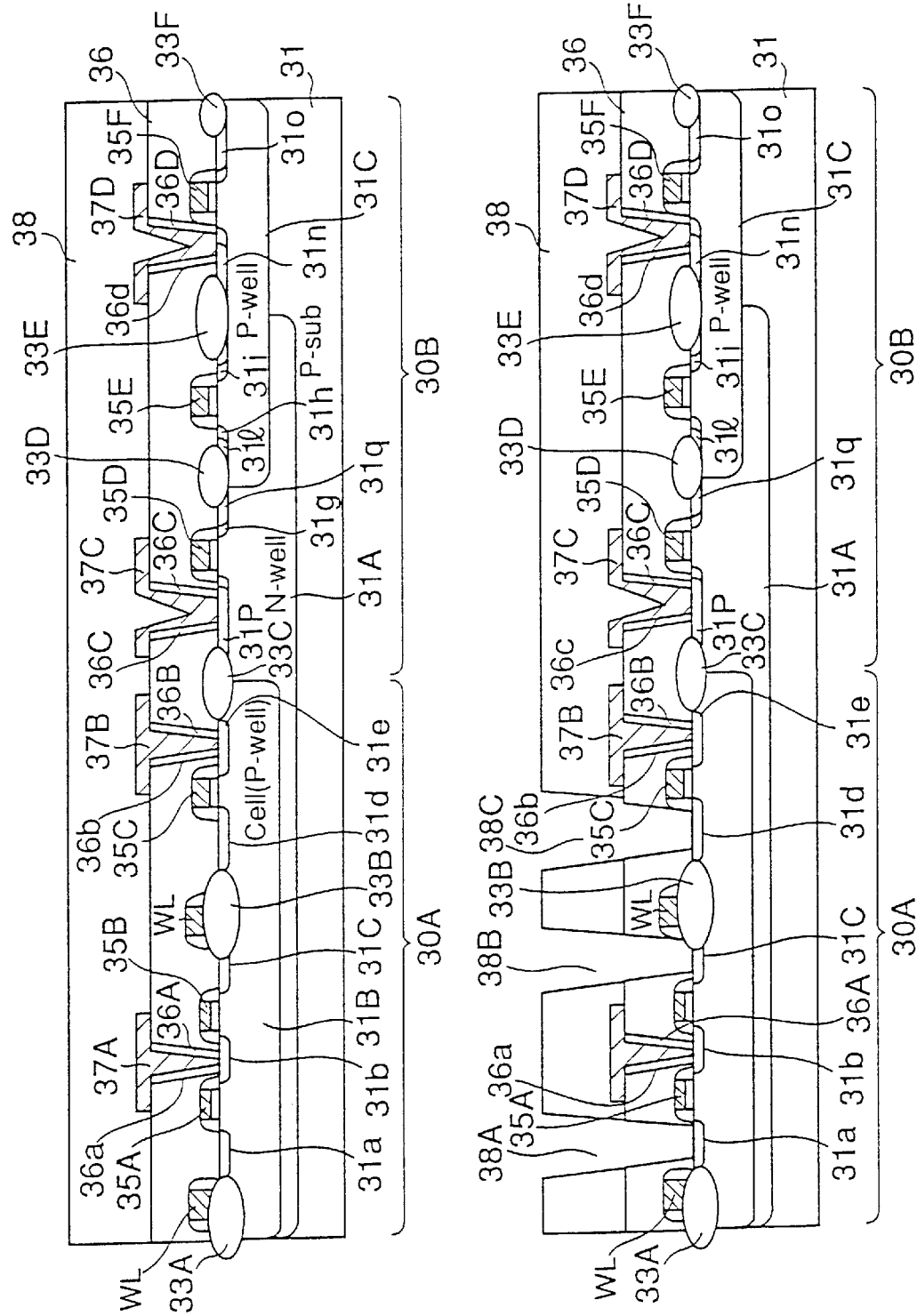

Next, in the step of FIG. 3C, a BPSG film 36 is deposited on the structure of FIG. 3B with a thickness of about 250 nm, and contact holes 36A–36D are formed in the BPSG film 36 so as to expose the foregoing diffusion regions 31b, 31e, 31p and 31n. Further, an oxide film is deposited on the BPSG film 36 by a thermal CVD process, followed by an etch-back process applied uniformly, to form side wall oxide films 36a–36d on the side wall of the contact holes 36A–36D, respectively. Further, electrodes 37A–37D, each formed of a stacking of an amorphous silicon pattern doped with P and a WSi pattern, are formed so as to cover the bottom surface of the contact holes 36A–36D, respectively. It should be noted that the electrodes 37A and 37B in the memory cell region 30B constitutes a bit line pattern. By forming the side wall oxide films 36a–36d on the contact holes 36A–36D, the problem of short circuit, which tends to occur when the contact holes are formed at an offset location, between the electrode in the contact hole and the adjacent gate electrode is effectively eliminated.

In the step of FIG. 3C, another BPSG film 38 is formed on the foregoing BPSG film 36 with a thickness of about 350 nm, such that the BPSG film 38 covers the electrodes 37A–37D.

Next, in the step of FIG. 3D, contact holes 38A–38C are formed in the BPSG film 38 of FIG. 3C so as to expose the diffusion regions 31a, 31c and 31d of the memory cell region 30A respectively, followed by the step of FIG. 3E to form memory cell capacitors such that the memory cell capacitor covers each of the contact holes 38A–38C.

FIGS. 4A–4D show the process steps between the step of FIG. 3D and the step of FIG. 3E in detail, wherein those parts corresponding to the parts described previously are designated by the same reference numerals and the description thereof will be omitted.

Figure 4A:
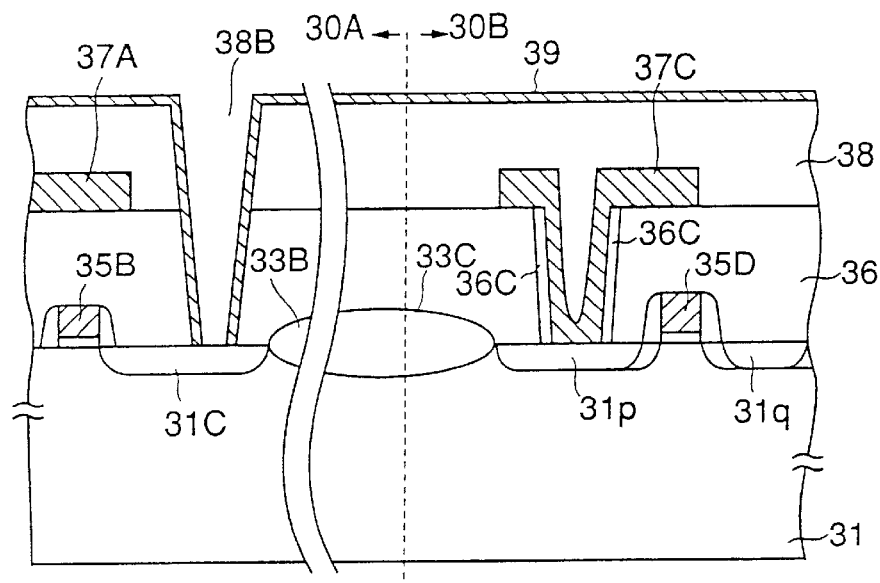
FIGS. 4A–4D are diagrams showing the process between the steps of FIGS. 3D–3E in detail.
Figure 4B:
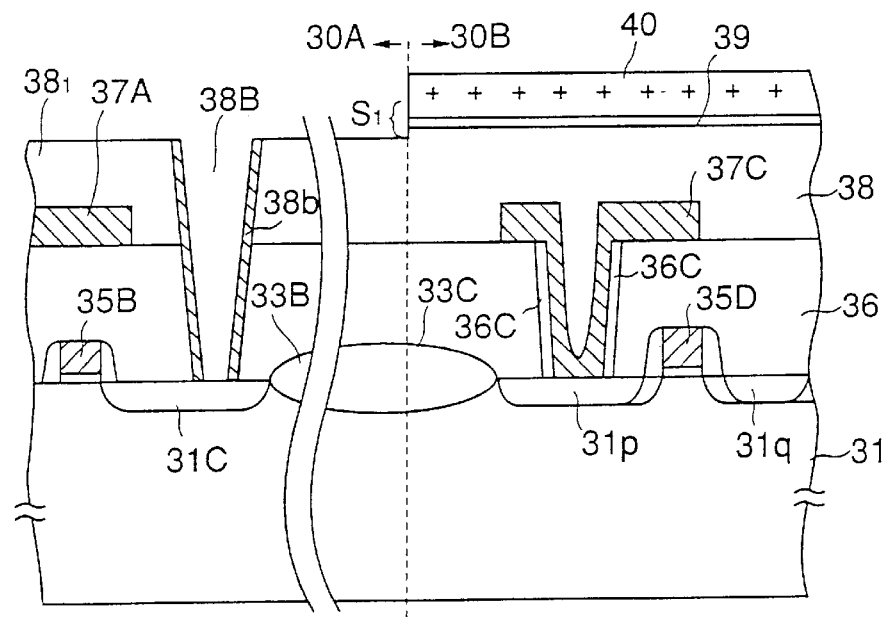

Referring to FIG. 4A, the BPSG film 38 is covered by an insulation film 39 of the material having an etching rate smaller than the etching rate of the BPSG film 36 or 38, such as SiO$_2$, SiN or SiON, such that the insulation film 39 covers the contact hole 38B. By applying an etch-back process to the insulation film 39 thus formed, a side wall insulation film 38b is formed such that the side wall insulation film 38b covers the side wall of the contact hole 38B as represented in FIG. 4B. It should be noted that the advantageous feature to be noted below can also be obtained even when the etching rate of the insulation film 39 is generally the same as the etching rate of the BPSG film 38.

Next, in the step of FIG. 4B, a resist pattern 40 covering the peripheral region 30B is formed on the insulation film 39 and the insulation film 39 is subjected to an etching process while using the resist pattern 40 as a mask. As a result of such an etching process, there is formed a surface 38$_1$ in the BPSG film 38 in correspondence to the memory cell region 30A at a level lower than the surface of the BPSG film 38 in the peripheral region 30B, wherein the surface 38$_1$ forms a step S$_1$ at the boundary between the memory cell region 30A and the peripheral region 30B.

Figure 4C:
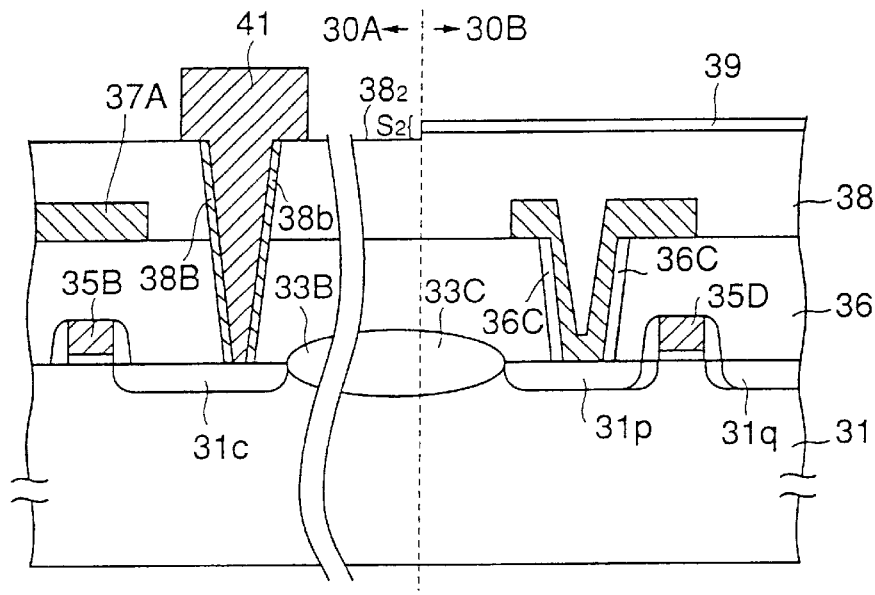

Next, in the step of FIG. 4C, the resist pattern 40 of FIG. 4B is removed and an amorphous silicon layer doped with P is deposited thereon. After patterning the amorphous silicon layer thus deposited, there is formed a storage electrode 41 forming a part of the memory cell capacitor such that the storage electrode 41 covers the contact hole 38B. It should be noted that the patterning of the storage electrode 41 is conducted by using a resist pattern (not shown) as a mask. Thus, the level of the surface of the BPSG film 38 is lowered in the memory cell region 30A further from the foregoing level 38$_1$ to a level 38$_2$. Associated with this, the step height between the memory cell region 30A and the peripheral region 30B increases from the foregoing step height of S$_1$ to S$_2$. It should be noted that there occurs little etching in the insulation film 39 during the foregoing patterning process of the storage electrode 41, as the etching rate of the insulation film 39 is substantially smaller than the etching rate of the BPSG film 38.

Figure 4D:
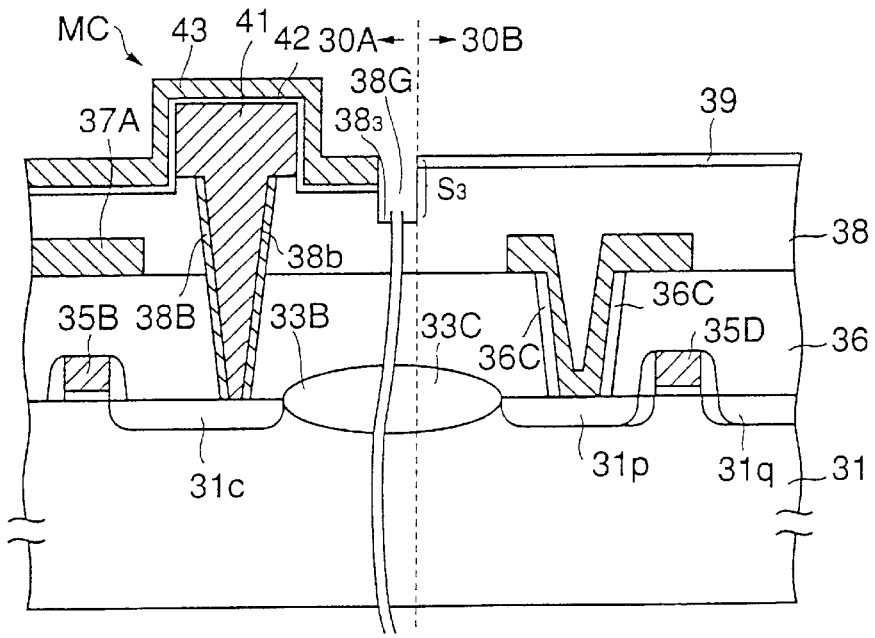

Next, in the step of FIG. 4D, a capacitor insulation film 42 of the so-called ONO structure is deposited on the structure of FIG. 4C, followed by a deposition of an amorphous silicon pattern doped with P on the capacitor insulation film 42 thus deposited. By conducting a patterning process on the amorphous silicon pattern thus deposited, there is formed an opposing electrode 43. Thereby, it should be noted that the BPSG film 38 experiences an etching in the memory cell region 30A associated with the patterning of the opposing electrode 38 and there is formed a groove 38G having a bottom surface 38$_3$ at the boundary between the memory cell region 30A and the peripheral region 30B. As the insulation film 39 has a reduced etching rate as compared with the BPSG film 38, the groove 38G forms a step S$_3$ which is even larger than the foregoing step S$_2$.

In the foregoing construction of the semiconductor device, it should be noted that the insulation film is formed in the peripheral region 30B with an increased thickness increased by the thickness of the insulation film 39 as compared with the memory cell region 30A. Further, in view of the fact that the BPSG film 38 is protected by the insulation film 39, which has a lower etching rate, the problem of the surface level of the BPSG film 36 becomes lower in the peripheral region than in the memory cell region and the associated problem of the global step height between the memory cell region and the peripheral region becoming larger, are minimized.

Figure 5:
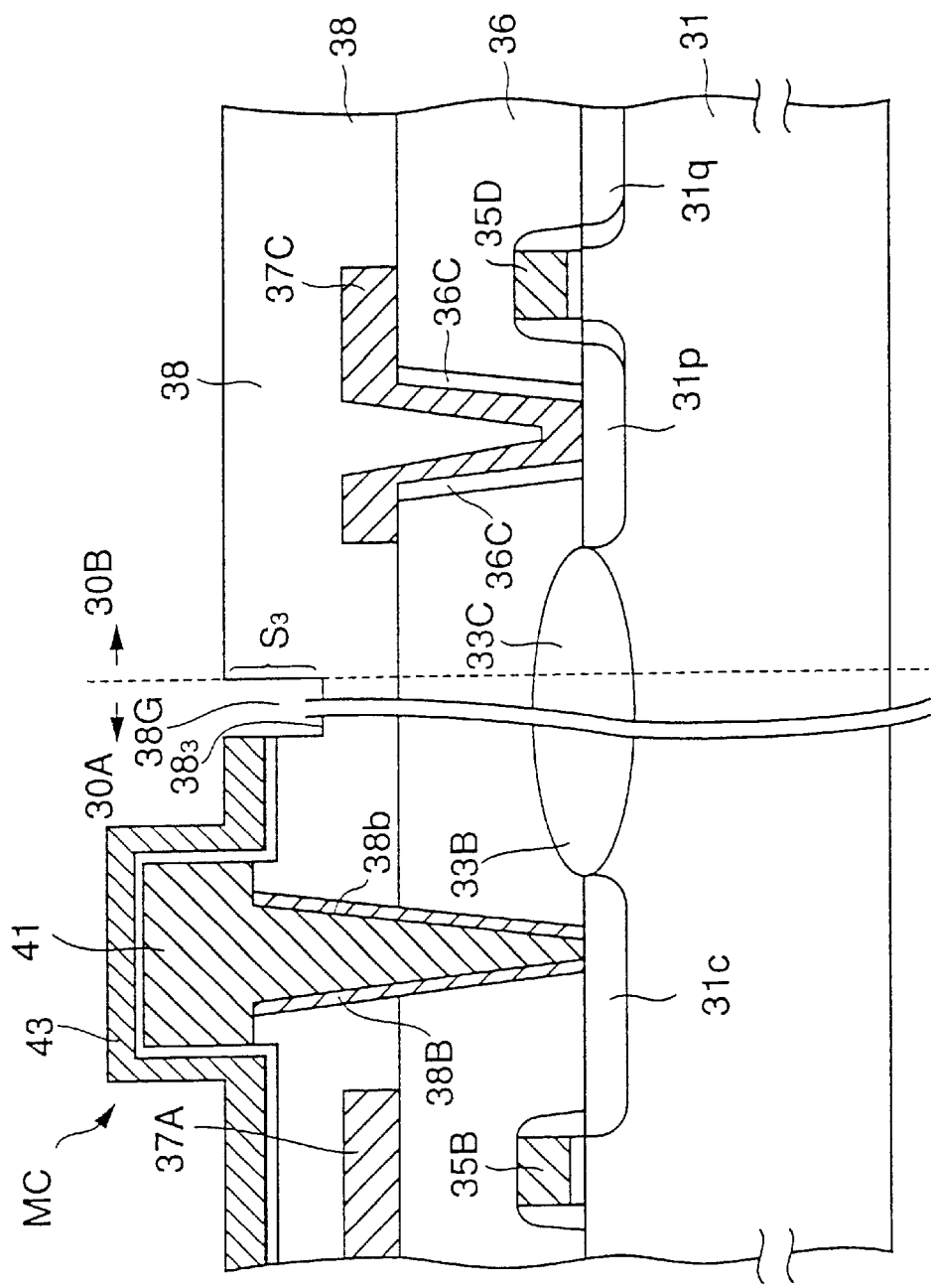
FIG. 5 is a diagram showing a modification of the structure of FIG. 4D.

In the step of FIG. 4D, it should be noted that there can be a case in which the insulation film 39 is removed entirely as a result of the formation of the memory cell capacitor as indicated in FIG. 5. It should be noted that FIG. 5 thus shows a modification of the structure of FIG. 4D.

It should be noted that the structure of FIG. 4D corresponds to the structure of FIG. 3E.

Thus, referring back to FIG. 3E, it can be seen that there is formed a memory cell capacitor MC including the storage electrode 41, the capacitor dielectric film 42 and the opposing electrode, in each of the contact holes 38A, 38B and 38C that are formed in the BPSG film 38 so as to expose the diffusion regions 31a, 31c and 31d.

Next, in the step of FIG. 3F, a BPSG film 44 is formed on the structure of FIG. 3E with a thickness of about 350 nm, and interconnection electrodes 45A and 45B are formed on the BPSG film 44 so as to make an electrical contract with the electrode 37C and the diffusion region 31o via respective contact holes 44A and 44B. Further, interconnection patterns 45C and 45D are formed on the BPSG film 44.

In the present embodiment, it should be noted that the surface level of the BPSG film 38 is maintained in the peripheral region. Thus, the problem of the global step formation in the BPSG film 44 in correspondence to the boundary between the memory cell region 30A and the peripheral region 30B is reduced, and the focusing at the time of the photolithographic patterning of the electrodes 45A and 45B or the interconnection patterns 45C and 45D is reduced substantially.

Third Embodiment

Figure 6:
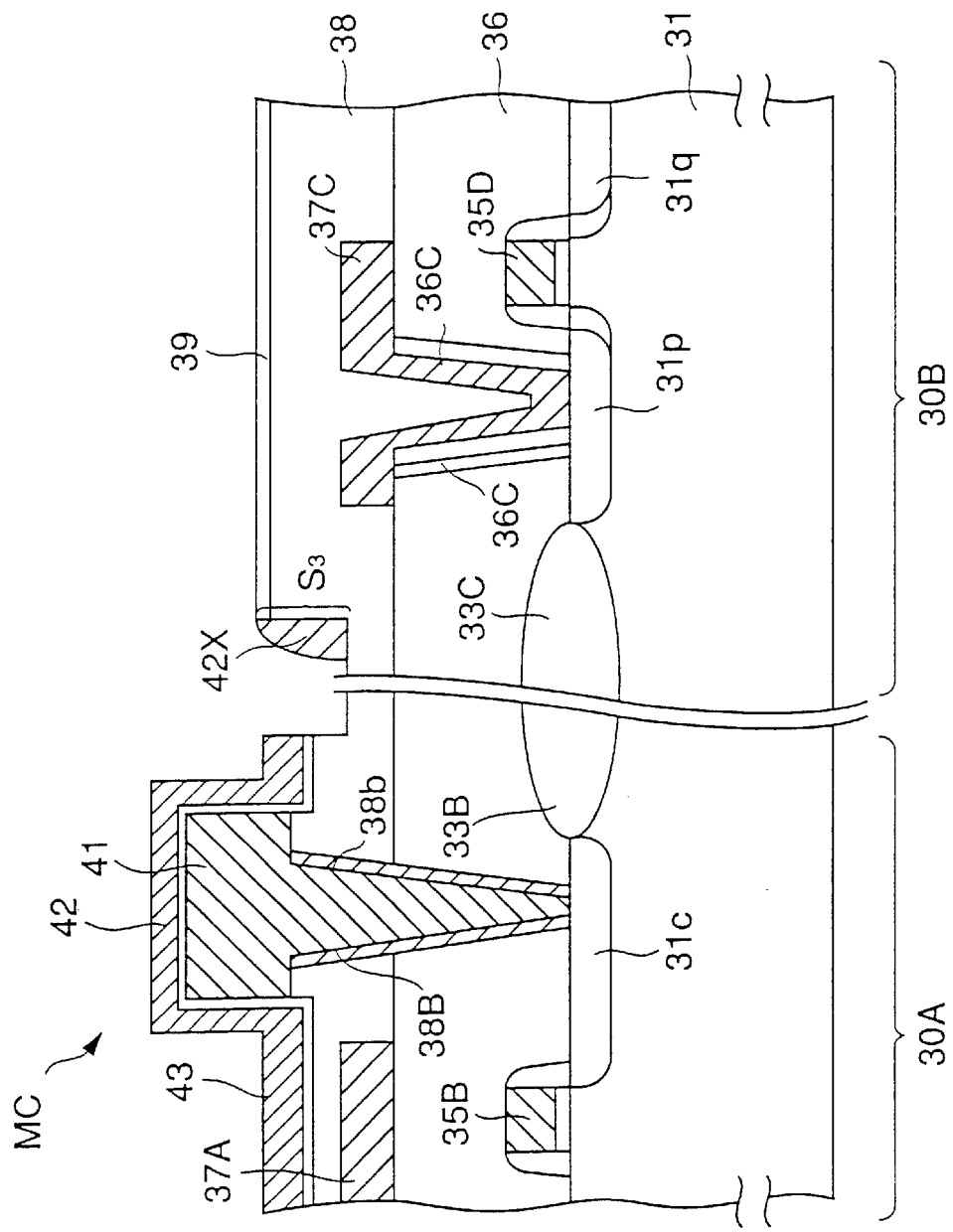
FIG. 6 is a diagram showing the conductor pattern remaining at the stepped part formed between a memory cell region and a peripheral region of a DRAM.

In the DRAM of the previous embodiment, there can be a case in which the conductor layer constituting the storage electrode 41 or the opposing electrode 43 remains unetched along the stepped part $S_3$ between the memory cell region 30A and the peripheral region 30B as an irregular pattern 42X at the time of the patterning of the storage electrode 41 or the opposing electrode 43 as represented in FIG. 6.

Figure 7A:
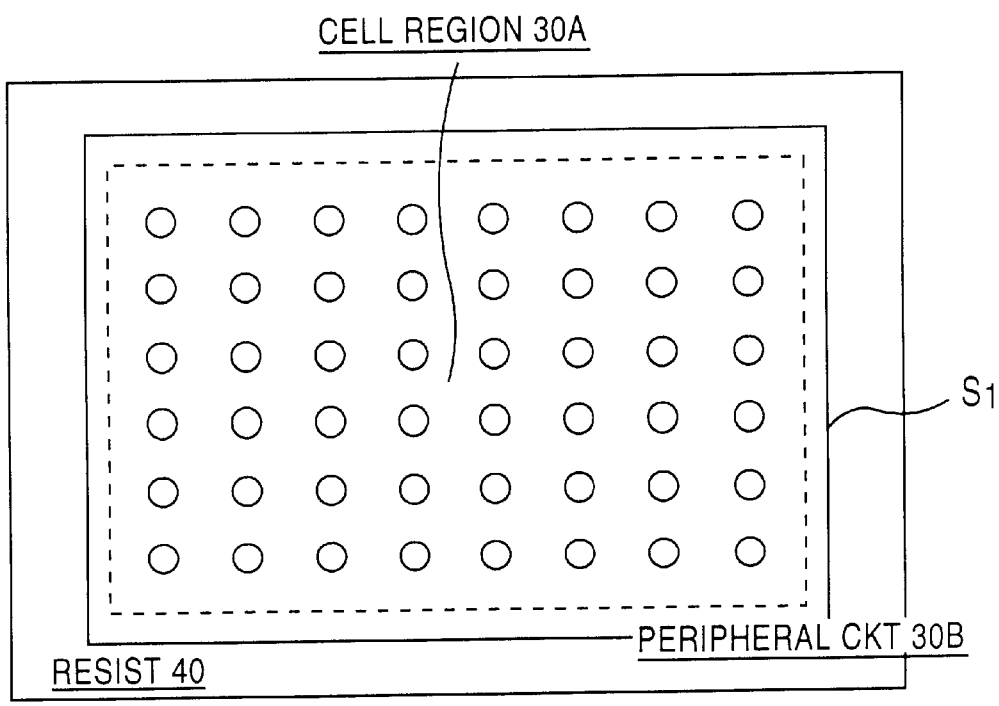
FIGS. 7A and 7B are diagrams explaining the formation of the residual conductor pattern of FIG. 6 in a plan view.
Figure 7B:
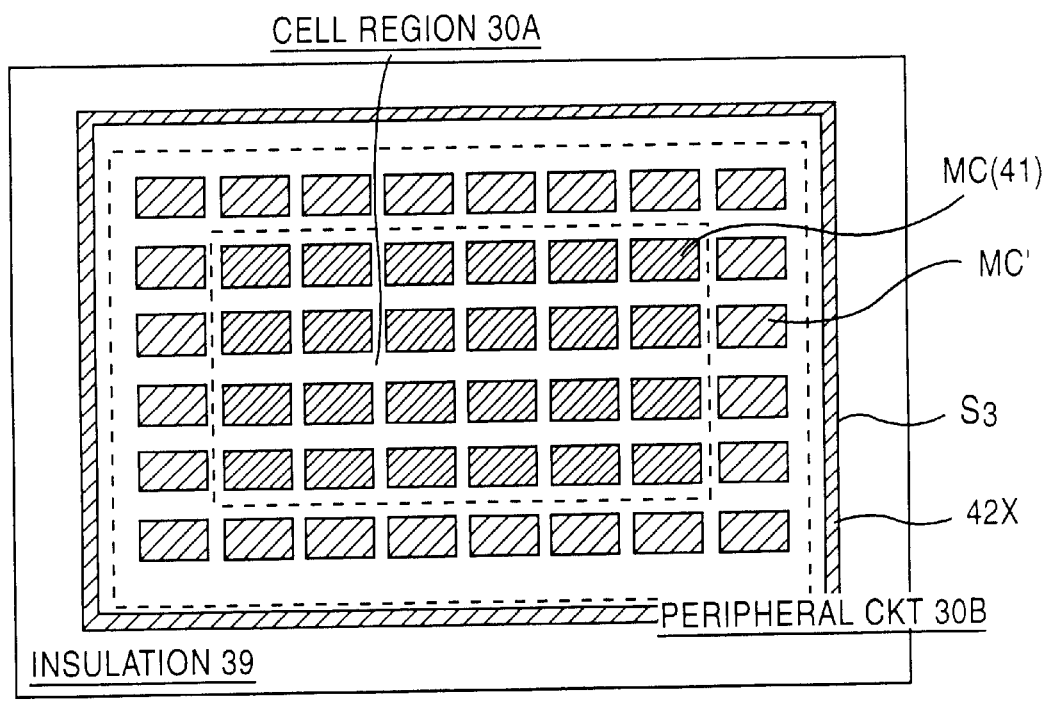

FIGS. 7A and 7B show the formation of the memory cell capacitor in the memory cell region 30A in a plan view, wherein FIG. 7A corresponds to the step of FIG. 4B.

Referring to FIG. 4A, there is formed a stepped part $S_1$ at the outer side of the memory cell region 30A represented by the broken line as a result of the patterning process conducted by the resist pattern 40, and contact holes 30A are formed in the memory cell region 30A in a row and column formation.

On the other hand, FIG. 4B corresponds to the foregoing step of FIG. 4D and shows the state in which the capacitors MC, each including the storage electrode 41 therein, are formed in the memory cell region 30A in correspondence to the contact holes 38B.

Referring to FIG. 7B, the peripheral region 30B is covered by the insulation film 39 and the foregoing irregular conductor pattern 42X is formed along the step $S_3$ extending along the boundary between the peripheral region 30B and the memory cell region 30A. Further, it should be noted that there are formed dummy memory cell capacitors MC' in the memory cell region 30A in correspondence to the part outer side of the region indicated by a broken line, wherein the dummy memory cell capacitor MC' has a construction identical with the construction of the dummy memory cell MC. As the residual, irregular conductor pattern 42X extends along the stepped part $S_3$, there is a substantial risk that the memory cell capacitor MC makes a short-circuit with the conductor pattern 42X in the structure in which the memory cell capacitors MC are formed also in the region outside the region indicated by the broken line. Such a short-circuit may occur when there is an error in the mask process for defining the memory cell region 30A and the peripheral region 30B. Thus, thee dummy memory cell capacitors MC' are formed along the outer boundary of the memory cell region 30A so as to surround the memory cell region 30A for avoiding the foregoing problem. Further, the formation of the dummy memory cell capacitors MC' is preferable in view of the fact that the photoresist pattern tends to become different between the outermost boundary part and the interior of the memory cell region.

It should be noted that the formation of the foregoing conductor pattern 42X along the stepped part $S_3$ is not particularly controlled. The pattern 42X is formed more or less spontaneously. Thus, there is a substantial risk that the conductor pattern 42X may scatter during the normal cleaning process. Thus, the conductor pattern 42X provides a potential threat with regard to the yield of the semiconductor device, and it is necessary to eliminate the scattering of the residual conductor pattern 42X.

Figure 8:
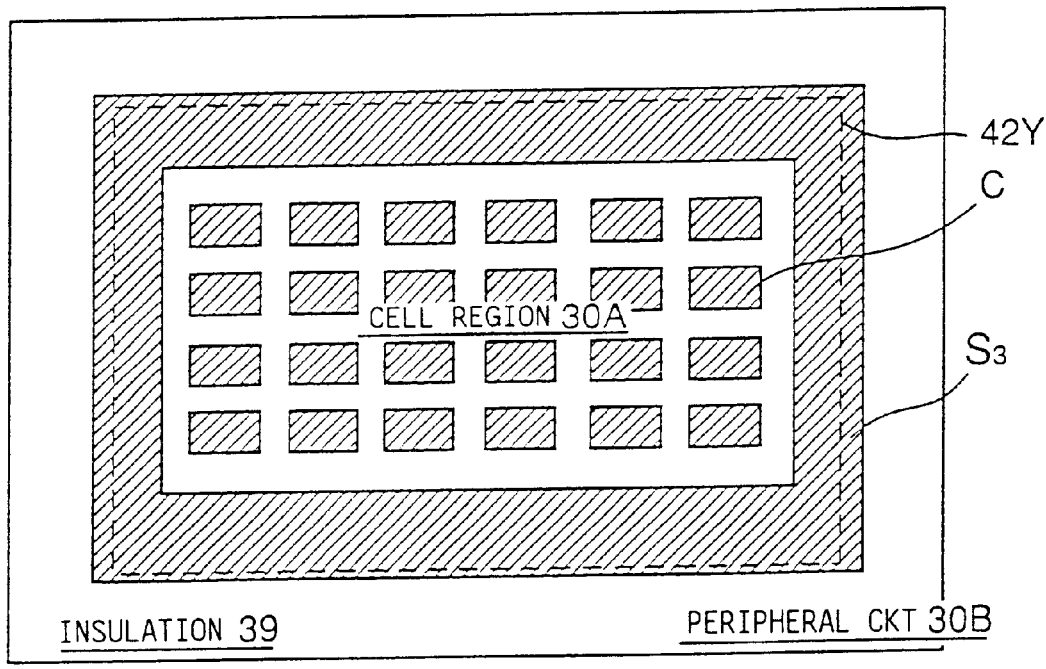
FIG. 8 is a diagram showing the construction of a semiconductor device according to a third embodiment of the present invention.

FIG. 8 shows the construction of a DRAM 50 according to a third embodiment of the present invention that addresses the foregoing problem.

Referring to FIG. 8, there is formed a conductor pattern 42Y covering the foregoing stepped part $S_3c$ so as to extend along the stepped part $S_3$, wherein the conductor pattern 42Y has a predetermined width and is formed simultaneously to the storage electrode 41 or the opposing electrode 43 of the memory cell capacitor C. As the conductor pattern 42Y thus formed has a predetermined width defined by a pair of straight edges, the problem of peeling or scattering of the irregular conductor pattern 41X pertinent to the conventional device is successfully eliminated.

Fourth Embodiment

Figure 9:
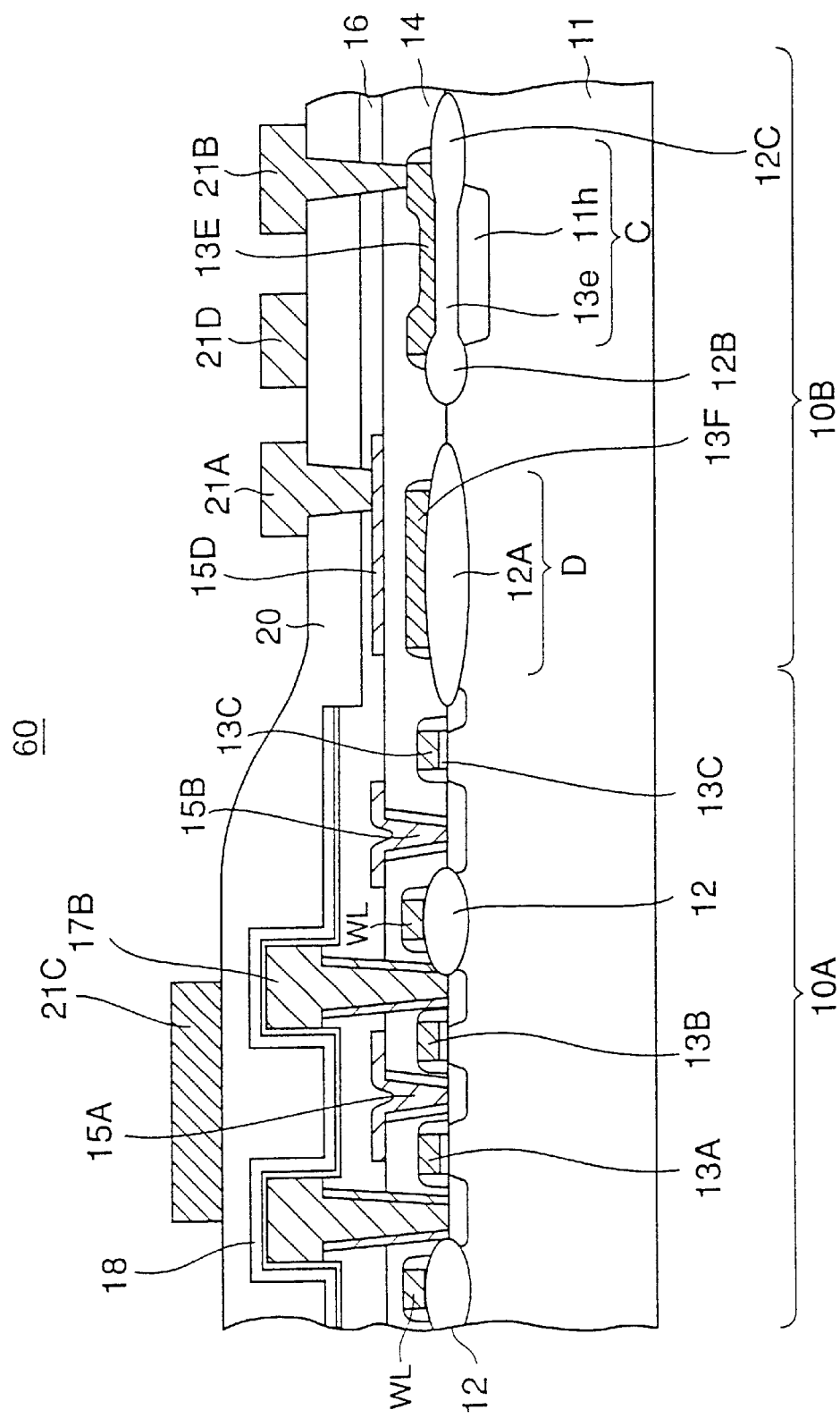
FIG. 9 is a diagram showing the construction of a semiconductor device having a capacitor in a peripheral region formed adjacent to a memory cell region.

FIG. 9 shows the construction of a DRAM 60 having a construction similar to that of the DRAM 10 of FIG. 1 except that the DRAM 60 includes another capacitor D on a field insulation film 12A formed in the peripheral region 10B in addition to the capacitor C. In FIG. 9, those parts corresponding to the parts described previously are designated by the same reference numerals and the description thereof will be omitted.

In the DRAM 10 of FIG. 1 explained previously, the capacitor C of the peripheral region 10B is formed on the diffusion region defined by the field insulation films 12B and 12C. Thus, it has been necessary to introduce the impurity element into the substrate 11 in correspondence to the diffusion region 11h with high concentration level prior to the formation of the gate electrode. After the ion implantation process, it has been necessary to conduct an oxidizing process to form the oxide film 13e. Because of such a process that uses an ion implantation process for forming the diffusion region 11h as a lower electrode of the capacitor C, the conventional DRAM 10 of FIG. 1 required an additional mask process. Further, because of the use of the high-concentration ion implantation in the construction of FIG. 1, there has been a tendency that the breakdown characteristic of the capacitor dielectric film of the capacitor C formed by the oxide film 13e is deteriorated. Further, the construction of FIG. 1 is disadvantageous in view of device miniaturization as the capacitor C is formed so as to cover the diffusion region 11h that is defined by the field insulation films 12B and 12C. Such a construction reduces the area of the substrate 11 available for the transistor.

In the case of the DRAM 60 of FIG. 9, the capacitor D is formed in the peripheral region 10B wherein the capacitor D includes a lower capacitor electrode 13F formed on the field oxide film 12A and the upper capacitor electrode 15D formed on the interlayer insulation film 14 of BPSG, wherein the interlayer insulation film 14 is interposed between the lower and upper capacitor electrodes 13F and 15D. As the capacitor D of such a construction does not require a mask process for high-concentration ion implantation process and the problem of deterioration of the capacitor oxide film 13e is successfully avoided.

On the other hand, the DRAM 60 of FIG. 9 has a problem, due to the fact that the interlayer insulation film 14 has a substantial thickness, in that the capacitance for a unit area is very small for the capacitor D and it is necessary to increase the capacitor area substantially in order to secure a sufficient capacitance for the capacitor D.

One may think of forming the capacitor D to have a construction identical with the construction of the memory cell capacitor formed in the memory cell region 30A. This approach, however, raises the problem of poor breakdown voltage for the capacitor D, as the voltage applied to the capacitor insulation film of a memory cell capacitor is usually controlled to be within ±½ supply voltage, depending on the High level or Low level stored in the memory cell capacitor. Thereby, it should be noted that the voltage applied to the opposing electrode is set to ½ supply voltage. In the case of the capacitor for use in the peripheral circuit, particularly an analog circuit, it is inevitable that the supply voltage is applied directly to the capacitor electrodes. Thus, the use of the memory cell capacitor for such a purpose causes the problem of poor breakdown characteristic. When the thickness of the capacitor insulation film is increased for improving the breakdown characteristic in the capacitor D having the structure of a memory cell capacitor, on the other hand, the capacitance of the DRAM is decreased simultaneously.

Figure 10A:
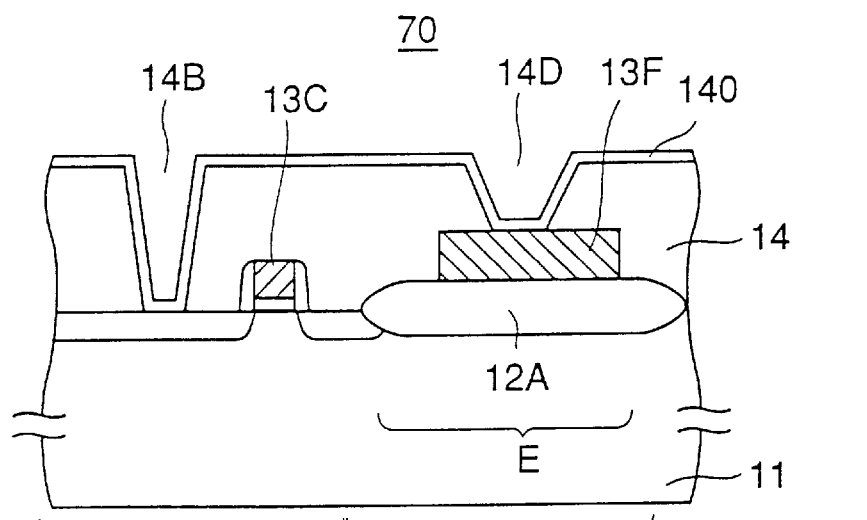
FIGS. 10A–10C are diagrams showing the construction of a semiconductor device according to a fourth embodiment of the present invention.
Figure 10B:
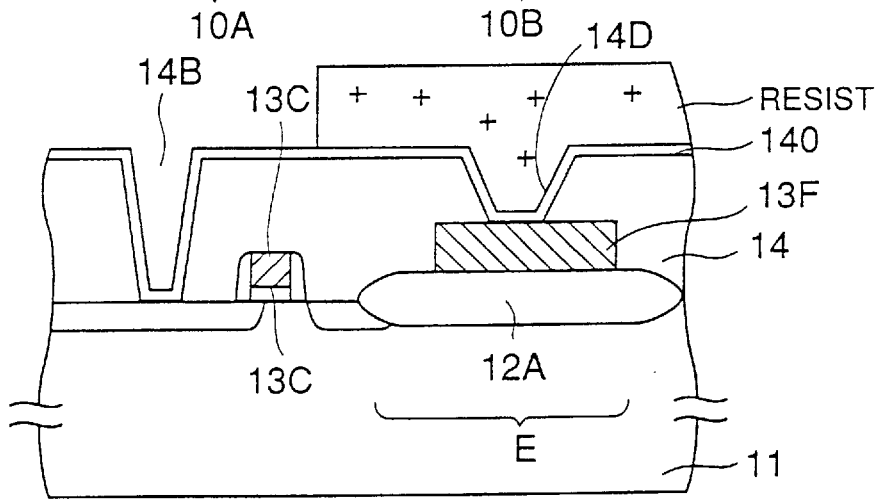
Figure 10C:
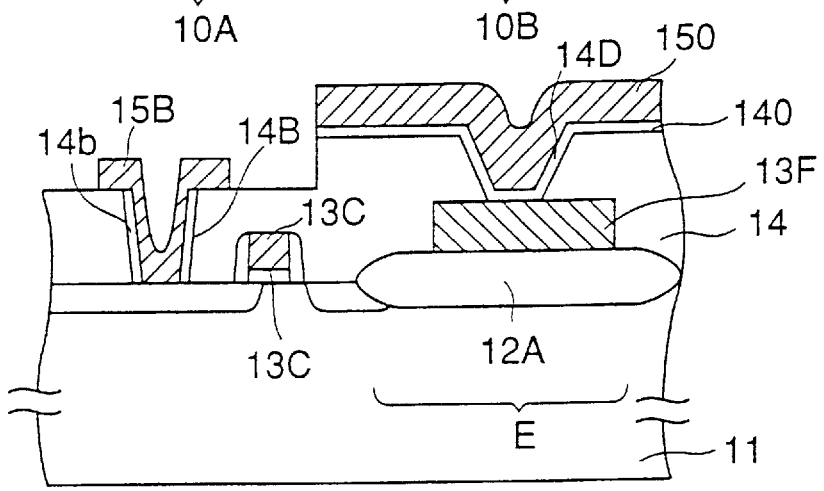

FIGS. 10A–10C show the fabrication process of a DRAM 70 according to a fourth embodiment of the present invention wherein the foregoing problems are eliminated, wherein those parts corresponding to the parts described previously are designated by the same reference numerals and the description thereof will be omitted.

Referring to FIG. 10A, there is formed an opening 14D exposing the electrode 13F on the field oxide film 12A in the interlayer insulation film 14, in addition to the contact hole 14B, and an insulation film 140 is deposited on the interlayer insulation film 12 so as to cover the contact hole 14B and the opening 14D according to respective cross-sectional shape. In the illustrated example, the interlayer insulation film 14 has a thickness of about 200 nm and the contact hole 14B has a size of about 0.3 μm. On the other hand, the opening 14D has a size that is determined according to the capacitance that is needed for the capacitor. Generally, the size of the opening 14D is much larger than the size of the contact hole 14B. With the increase in the integration density, the size of the contact hole 14B is reduced further.

Next, in the step of FIG. 10B, the part of the insulation film 140 covering the peripheral region 10B is covered by a resist pattern and the insulation film 140 is subjected to an etch-back process in the memory cell region 10A. Thereby, a side wall insulation film 14b is formed on the side wall of the contact hole 14B.

In the step of FIG. 10B, it should be noted that the insulation film 140 remains in the peripheral region 10B unetched and thus, the bottom part of the opening 14D is covered with the insulation film 140. It should be noted that the insulation film 140 is formed by a thermal CVD process with a thickness of about 70 nm. In this case, there is formed a side wall insulation film having a thickness of about 80% or 56 nm (=70×0.8) on the side wall of the contact hole 14B, and the contact hole 14B thus obtained as an effective size of about 0.2 μm (=0.3 μm–56 nm×2).

Thus, by forming the insulation film 140 to have a thickness of 70 nm, it is possible to form the contact hole 14B to have an effective size of about 0.1 μm for the case in which the initial size of the contact hole 14B is 0.2 μm. It should be noted that this size of the contact hole does not cause any specific problem in the DRAM. When the initial size of the contact hole 14B is smaller than 0.2 μm, on the other hand, it is necessary to reduce the thickness of the insulation film 140. This decrease of the thickness of the insulation film 140 is preferable in view of the fact that the thickness of the capacitor insulation film in the peripheral region 10B experiences a similar decrease. Thus, in the case the capacitance of the analog peripheral circuit is important, the insulation film 140 is formed to have a reduced thickness.

Next, in the step of FIG. 10C, the resist pattern is removed and a conductor layer is deposited uniformly. After patterning the conductor layer thus deposited, there are formed an electrode 15B covering the contact hole 14B and the electrode 150 covering the opening 14D. It should be noted that the electrode 150 is separated from the electrode 13F in the opening 14D from the foregoing insulation film 140, and because of this, the electrode 150 forms a capacitor E corresponding to the capacitor D together with the electrode 13F and the insulation film 140.

In the DRAM 70 of the present invention, it should be noted that the capacitor E formed on the field oxide film 12A uses the insulation film 140 as the capacitor insulation film, wherein the insulation film 140 is the film identical with the insulation film forming the side wall insulation film. Thus, the capacitor E has a thin capacitor insulation film, having a thickness less than ⅓ the thickness of the capacitor insulation film of the capacitor D, and associated with this, the capacitor E realized a large capacitance.

During the process of forming the capacitor E, there is an additional mask process for patterning the insulation film 140. On the other hand, the overall number of the mask processes does not change in the present embodiment, as the mask process for forming the diffusion region 11h can be eliminated.

Fifth Embodiment

Figure 11:
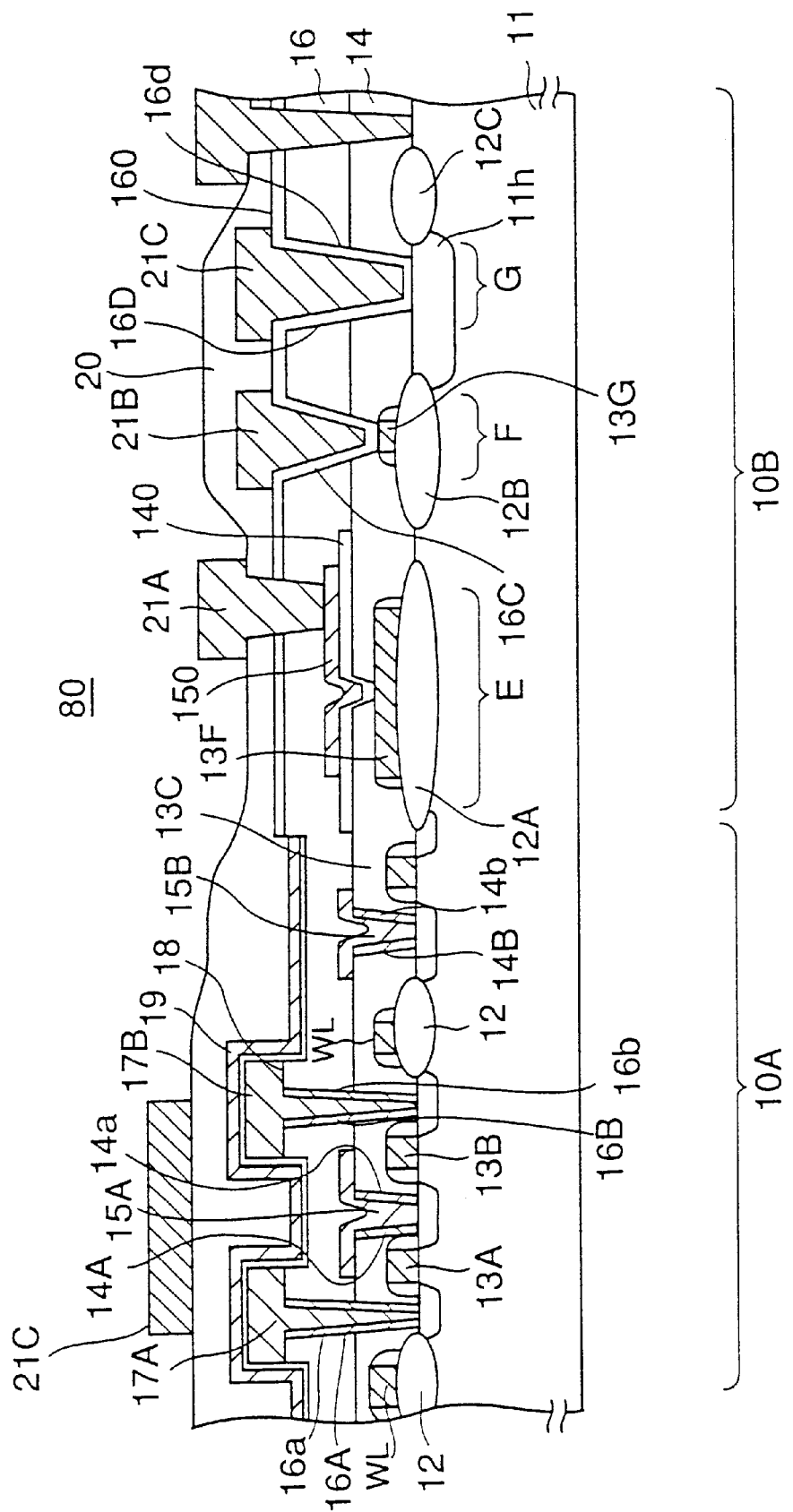
FIG. 11 is a diagram showing the construction of a semiconductor device according to a fifth embodiment of the present invention.

FIG. 11 shows the overall construction of a DRAM 80 according to a fifth embodiment of the present invention, wherein those parts corresponding to the parts described previously are designated by the same reference numerals and the description thereof will be omitted.

Referring to FIG. 11, the DRAM 80 includes, in addition to the capacitor E, a capacitor F formed in the peripheral region in correspondence to an opening 16C formed in the interlayer insulation film 16 and further a capacitor G formed in correspondence to an opening 16D formed also in the interlayer insulation film 16D, wherein the capacitor F includes a lower electrode 13G formed on the field oxide film 12B concurrently with the gate electrodes 13A–13C and is exposed by the foregoing opening 16C, a capacitor insulation film 160 formed simultaneously with the side wall insulation film 16a or 16b of the contact hole 16A or 16B so as to cover the opening 16C, and an upper electrode 21B formed on the capacitor insulation film 160 so as to cover the opening 16C. It should be noted that the capacitor insulation film 160 corresponds to the insulation film 39 of FIG. 4D.

On the other hand, the capacitor G is formed of the diffusion region 11h exposed by the opening 16D, the capacitor insulation film 160 formed on the interlayer insulation film 16 so as to cover the opening 16D, and the upper electrode 21C formed on the capacitor insulation film 160 so as to cover the opening 16D. It should be noted that the capacitor insulation film 160 corresponds to the insulation film 39 of FIG. 4D.

In the DRAM 80 of the present embodiment, it should be noted that the capacitor E or F is formed on the field oxide film 12A or 12B, and thus, there occurs no problem of decrease in the integration density of the integrated circuit. Further, it should be noted that the capacitor insulation film 140 of the capacitor E is formed of the same insulation film forming the side wall insulation film 14a or 14b, as noted above. Thereby, it is necessary to conduct an additional mask process for patterning the capacitor insulation film 140. However, this increase in the number of the mask process is effectively compensated for by the elimination of the mask process for forming the diffusion region 11h that is used in the step of FIG. 9 for forming the capacitor C. Thereby, there is no overall increase in the number of the mask processes.

In the capacitor F, it should be noted that capacitor insulation film 160 is formed of an insulation film that also forms the side wall insulation films 16a and 16b. Thus, there is no need of additional mask processes. As the process of forming the diffusion region 11h, used in the process of FIG. 9, is also eliminated, overall number of the mask steps can be reduced. In the capacitor G, too, the increase in the number of the mask steps is avoided as compared with the case of the capacitor C of FIG. 9.

It should be noted that the construction of FIG. 11, showing the capacitors E, F and G, is merely for the purpose of explanation of the principle of FIGS. 10A–10C and does not mean that all of these three capacitors have to be provided in the DRAM 80.

Sixth Embodiment

Figure 12:
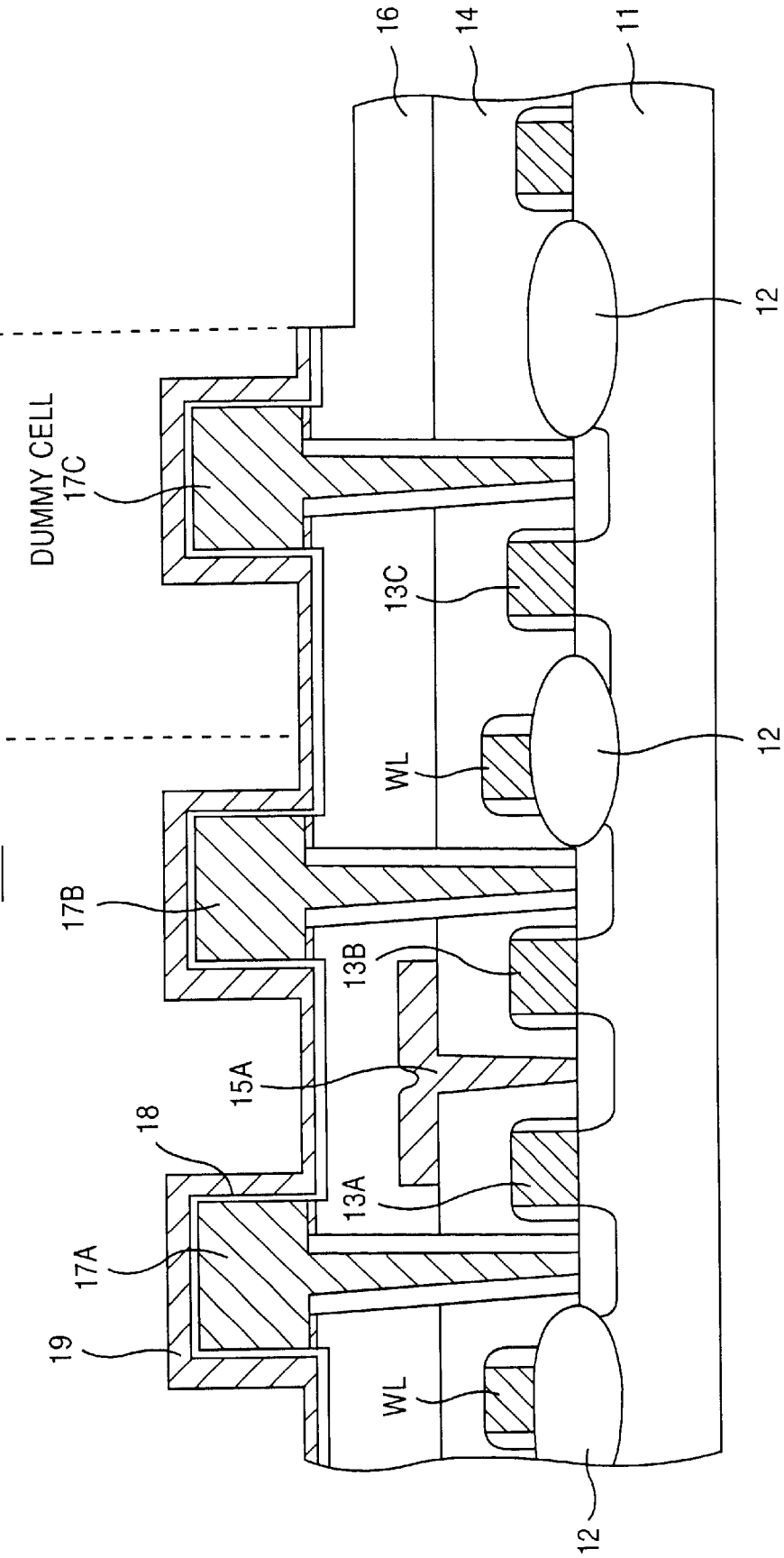
FIG. 12 is a diagram showing the construction of a conventional dummy cell.

FIG. 12 shows the part of the DRAM 10 of FIG. 1 including the memory cell region 10 in detail, wherein those parts corresponding to the parts described previously are designated by the same reference numerals and the description thereof will be omitted.

In the construction of FIG. 12, dummy memory cells similar to the dummy memory cell explained with reference to FIG. 7B are formed on the peripheral part of the memory cell region 10A, while such dummy memory cells, not contributing to the storage of information, causes a decrease in the integration density of the DRAM 10.

Figure 13C:
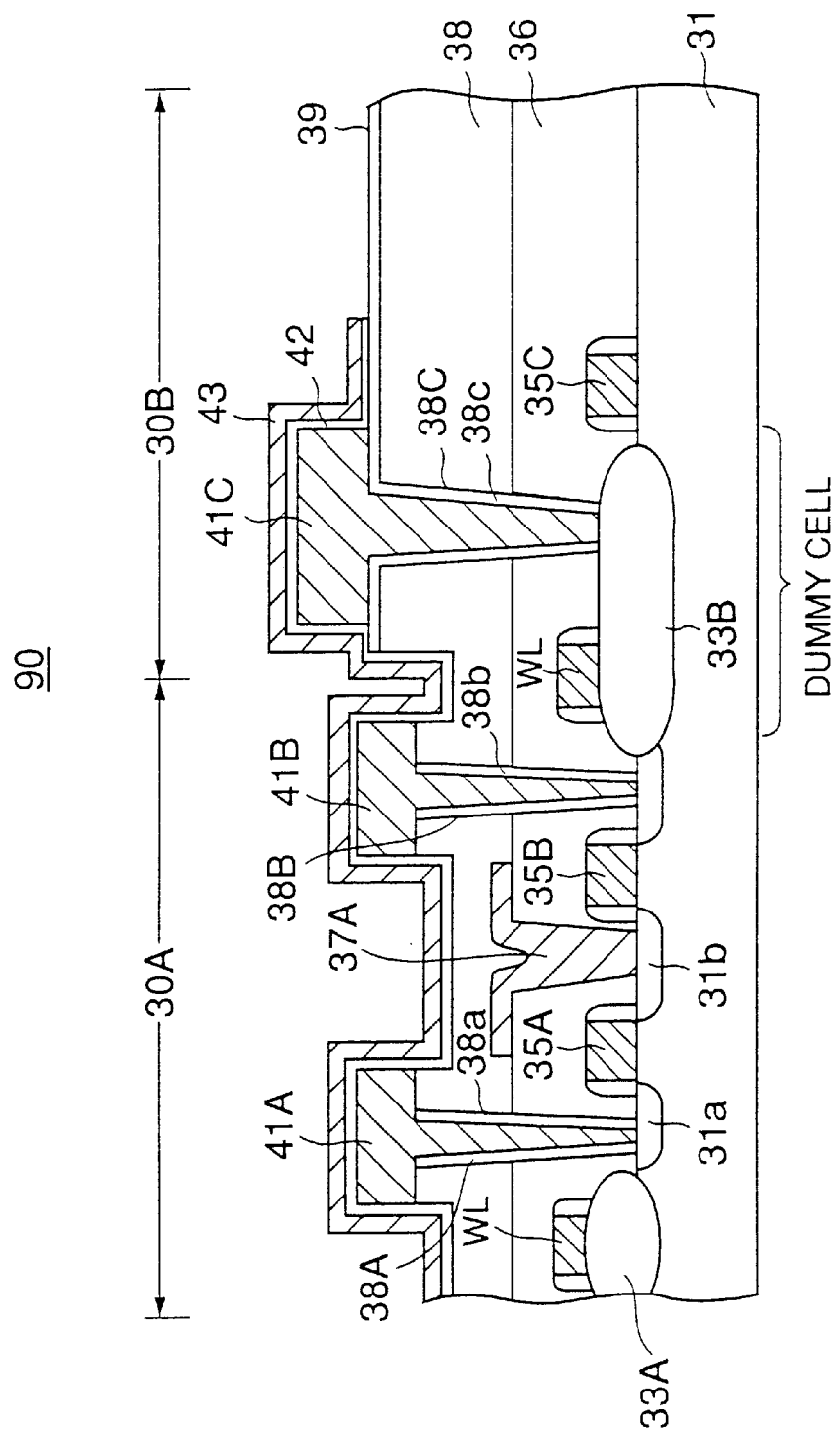

FIGS. 13A–13C show the fabrication process of a DRAM 90 according to a sixth embodiment of the present invention that addresses the foregoing problem of the prior art, wherein those parts corresponding to the parts described previously are designated by the same reference numerals and the description thereof will be omitted.

Referring to FIG. 13A, the contact hole 38C is formed so as to expose the field oxide film 33B, followed by a deposition of the insulation film 39. Next, in the step of FIG. 13B, the peripheral region 30B is protected by a resist pattern and the insulation film 39 is etched back in the memory cell region 30A. As a result, side wall oxide films 38a and 38b are formed on the contact holes 38A and 38B, respectively. In the present embodiment, it should be noted that the dummy cells are formed in the peripheral region 30B along the boundary between the peripheral region 30B and the memory cell region 30A.

Next, in the step of FIG. 13C, storage electrodes 41A and 41B are formed so as to cover the contact holes 38A and 38B, and further a storage electrode 41C is formed so as to fill the contact hole 38C. Thereby, it should be noted that the storage electrodes 41A and 41B make a contact with the diffusion regions 31a and 31c in the substrate 31 respectively, while the storage electrode 41C constituting the dummy memory cell is interrupted at the bottom part thereof and does not make a contact with the diffusion region.

After the formation of the storage electrodes 41A–41C, there is formed a capacitor dielectric film 42 so as to cover the storage electrode 41A–41C, and an opposing electrode 43 is formed further on the dielectric film 42.

In the present embodiment, the dummy memory cell capacitors are formed on the field oxide film 33. Thereby, the dummy memory cell capacitor does not occupy the active area of the substrate unnecessarily, and the integration density of the DRAM is increased.

In the present embodiment, it should be noted that the top part of the dummy storage electrode 41C is covered with the foregoing insulation film 39. Thus, there occurs no problem even when the contact hole 38C is formed so as to penetrate through the field oxide film 33B. As long as the top part of the dummy storage electrode 41C is covered by the insulation film 39, the contact hole 38 can be formed at an arbitrary location. For example, the contact hole 38 may be formed on the top of the electrode 35C.

Seventh Embodiment

Figure 14A:
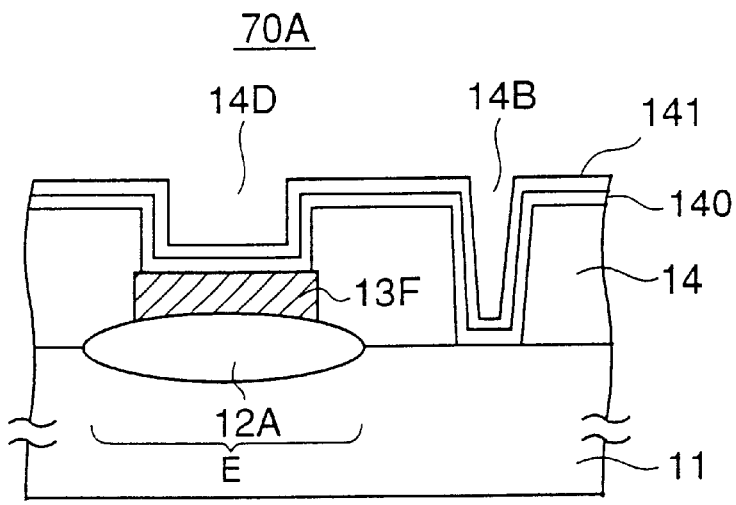
FIGS. 14A–14C are diagrams showing the construction of a semiconductor device according to a seventh embodiment of the present invention.
Figure 14B:
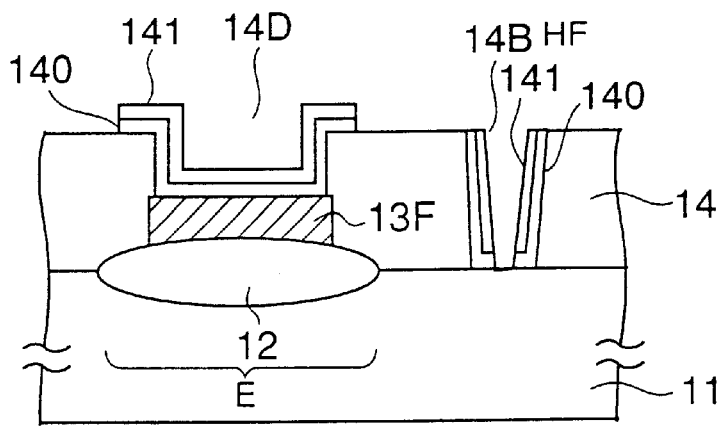
Figure 14C:
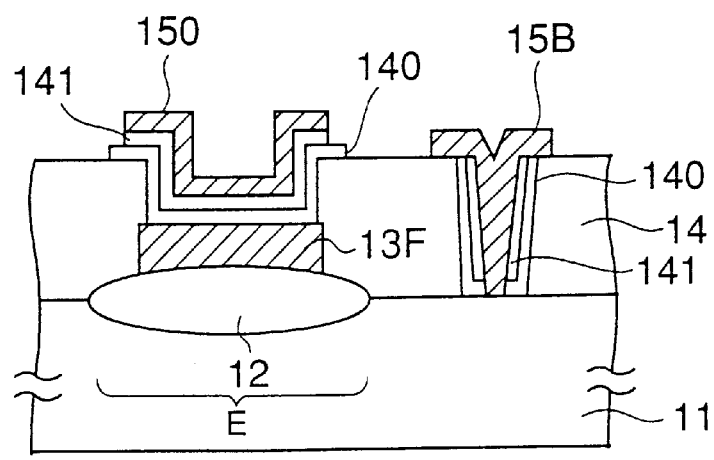

FIGS. 14A–14C show the fabrication process of a DRAM 70A according to a seventh embodiment of the present invention, wherein those parts corresponding to the parts described previously are designated by the same reference numerals and the description thereof will be omitted. It should be noted that the DRAM 70A is a modification of the DRAM 70 described with reference to FIGS. 10A–10C.

Referring to FIG. 14A, a structure similar to the structure of FIG. 10A is formed, wherein the structure of FIG. 14A further includes a polysilicon or amorphous silicon film 141 doped with P such that the conductive film 141 covers the $SiO_2$ film 140. It should be noted that the right-side and left-side are reversed in FIGS. 14A–14C as compared with the representation of FIGS. 10A–10C.

Next, in the step of FIG. 14B, the polysilicon film 141 is patterned by using a resist pattern similar to that of FIG. 13B, and the $SiO_2$ film 140 underneath is patterned further while using the same resist pattern as a mask. As a result of the patterning, the Si substrate 11 is exposed at the bottom of the contact hole 14B. As will be seen from FIG. 14B, the $SiO_2$ film 140 covering the side wall of the contact hole 14B is further covered by the polysilicon film. Similarly, the $SiO_2$ film constituting the capacitor insulation film of the capacitor E is also covered by the polysilicon film 141.

Next, the structure of FIG. 14B is immersed in an aqueous solution of HF, and the native oxide film is removed from the exposed surface of the Si substrate 11. Thereby, the $SiO_2$ film 140 is protected by the polysilicon film 141 in any of the contact hole 14B and the capacitor E and the problem of pinhole formation in the side wall insulation film 140 of the contact hole 14B or in the capacitor insulation film 140 of the capacitor E is eliminated.

Further, in the step of FIG. 14C, the bit line electrode 15B and the capacitor electrode 150 are formed respectively on the contact hole 14B and the capacitor E so as to cover the polysilicon film 141.

As explained before, such a structure allows the treatment in the HF solution for removing the native oxide film from the substrate surface at the bottom part of the contact hole 14B. Thereby, it becomes possible to reduce the contact resistance of the bit line and achieve a reliable electrical contact.

In the present embodiment, the bit line electrode 15B and the capacitor electrode 150 may be formed of a conductive material such as W, Al, polysilicon WSi, or a stacked body thereof. Further, it is possible to replace the side wall polysilicon film 141 by other conductive film such as W.

Thus, it is possible to form the side wall conductive film 141 by a polysilicon layer doped with P to a first concentration level and the bit line electrode 15B as a stacked body of a polysilicon layer doped with P to a second, higher concentration level and a W layer formed thereon. Further, both of the side wall conductive film 141 and the bit line electrode 15B may be formed of W.

Eighth Embodiment

FIGS. 15A–15D show the fabrication process of a semiconductor integrated circuit 200 according to an eighth embodiment of the present invention, wherein the semiconductor integrated circuit has a construction in which an analog integrated circuit and a DRAM are formed monolithically on a common substrate 101.

Figure 15A:
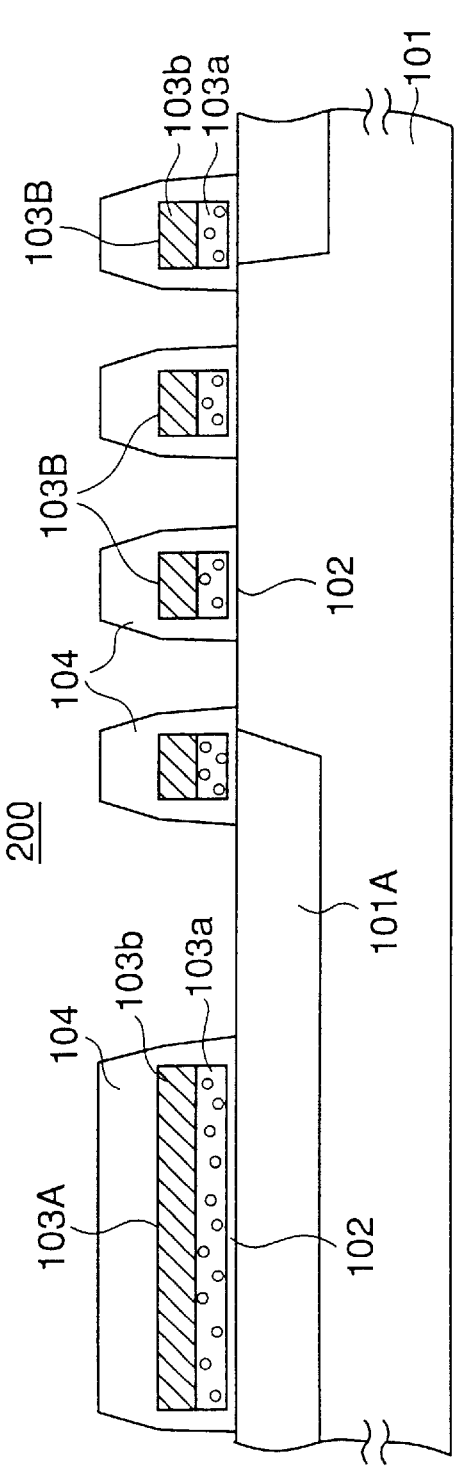

Referring to FIG. 15A, a p-type substrate 101 is formed with an n-type well 101A in correspondence to the analog integrated circuit, and an electrode pattern 103A is formed in the n-type well 101A with a gate oxide film 102 interposed between the gate electrode pattern 103A and the Si substrate 101. The gate oxide film 102 thereby covers the surface of the Si substrate 101. It should be noted that the electrode pattern 103A has a stacked construction in which a polysilicon film 103a is covered by a WSi film 103b. Similarly, there are formed a plurality of gate electrodes 103B on the DRAM region of the substrate 101, wherein the surface of the Si substrate 101 is covered by the foregoing gate oxide film 102. It should be noted that each of the gate electrodes 103B has a construction in which the polysilicon film 103a and the WSi film 103b are stacked similarly to the electrode 103A. Each of the electrode pattern 103A and the gate electrode patterns 103B has a top surface and both side walls covered by an SiN film 104.

Figure 15B:
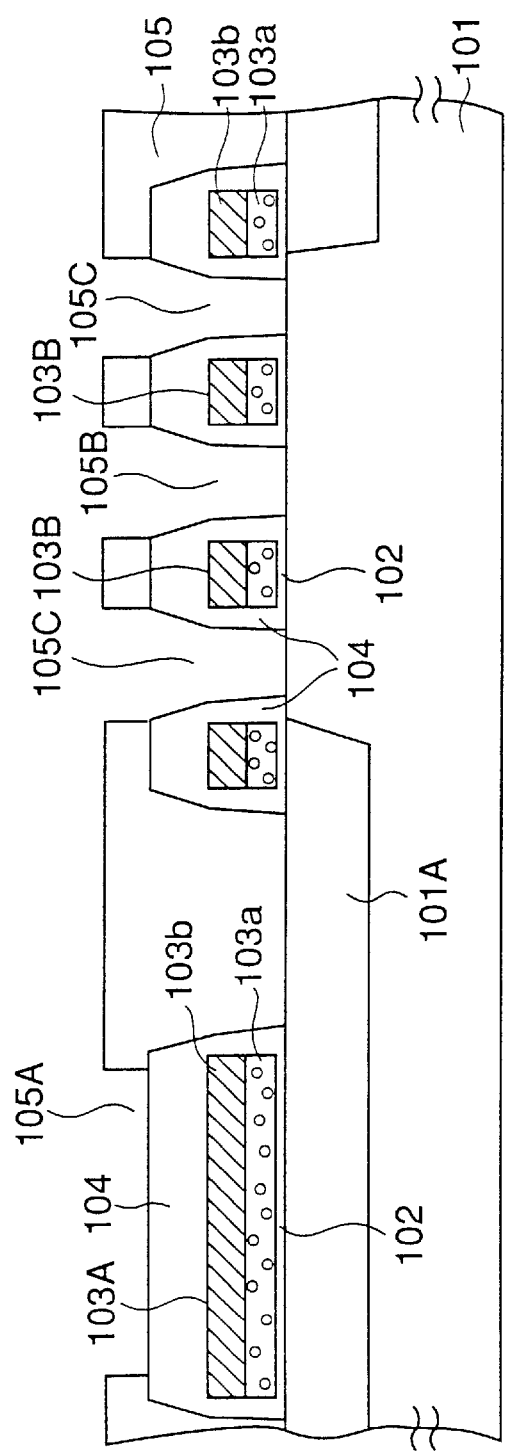

Next, in the step of FIG. 15B, an interlayer insulation film 105, which may be formed of BPSG, PSG or HSG, is deposited on the structure of FIG. 15A, followed by a planarization process conducted by a chemical mechanical polishing (CMP) process, and the interlayer insulation film 105 is formed with an opening 105A in correspondence to the electrode pattern 103A and further a the bit line contact hole 105B and memory cell contact holes 105C in correspondence to the diffusion regions (not shown) that are formed in the Si substrate 101 between the plurality of gate electrodes 103B. Thereby, it should be noted that the opening 105A exposes the SiN film 104 on the electrode pattern 103A, while the bit line contact hole 105B or the memory cell contact hole 105C exposes the surface of the Si substrate 101. It is preferable to form the interlayer insulation film 105 such that the interlayer insulation film 105 has a thickness of at least 50 nm in correspondence to the part above the electrode pattern 103A after the planarization process.

Preferably, the opening 105 and the contact holes 105B and 105C are formed by an RIE process typically using a mixture of $C_4F_8$, Ar, CO and $O_2$ such that the RIE process acts preferentially on the silicon oxide film or silicate glass film, such as $SiO_2$ film or BPSG as film, as compared with an SiN film. In this case, the formation of the contact hole 105B and 105C are conducted while using the SiN film 104 as a self-aligned mask. Thus, according to the present invention, it is not necessary to use a specially made mask or an exposure apparatus for forming the minute contact hole 105B or 105C, and the contact holes 105B and 105C are formed simultaneously to the step of forming the opening 105A. The etching process for forming the opening 105A stops spontaneously in response to the exposure of the SiN film 104 covering the electrode pattern 103A.

Figure 15C:
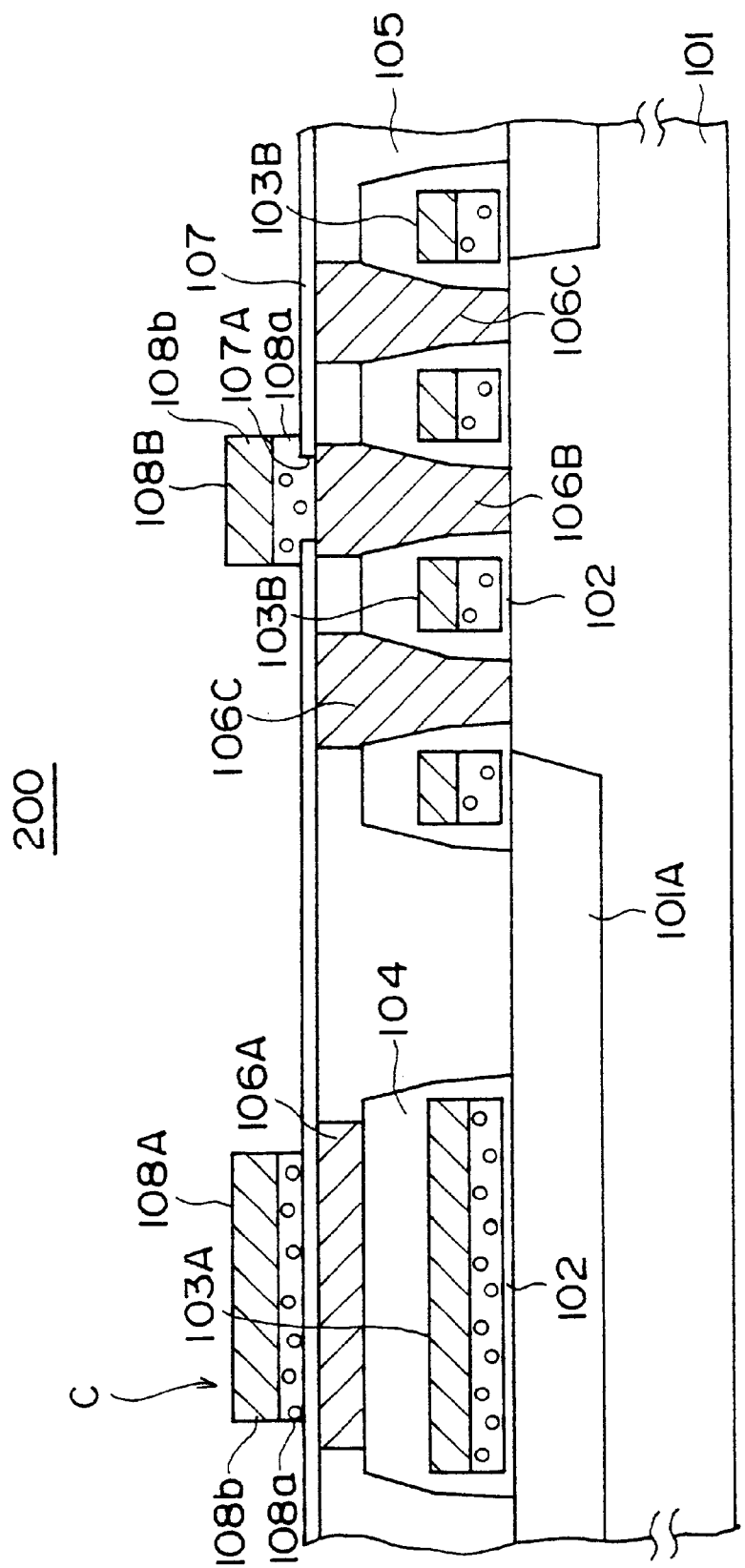

Further, in the step of FIG. 15C, the structure is covered with a conductive amorphous silicon layer (not shown) doped with P with a thickness of 200–400 nm, such that the conductive amorphous silicon layer fills the opening 105A and the contact holes 105B and 105C. Further, the part of the amorphous silicon film covering the interlayer insulation film 105 is removed by a CMP process, and there are formed conductive amorphous silicon plugs 106A–106C such that the amorphous silicon plug 106A fills the opening 105A, and the amorphous silicon plugs 106B and 106C fill the contact holes 105B and 105C. The amorphous silicon plug 106A thus formed constitutes the lower electrode of the analog integrated circuit.

Next, in the step of FIG. 15C, an $SiO_2$ film 107 is deposited on the interlayer insulation film 105 with a thickness of 30–70 nm, and an opening 107A is formed in the $SiO_2$ film 107 so as to expose the conductive plug 106B that fills the bit line contact hole 105B, by conducting an RIE process while using a mixture of $CF_4$, $CHF_3$ and Ar as an etching gas. Further, a polysilicon film 108a and a WSi film 108b are formed on the $SiO_2$ film 107 with respective thicknesses of 50 nm and 100 nm, wherein the films 108a and 108b thus deposited are subjected to a patterning process to form a capacitor upper electrode 108A in correspondence to the capacitor lower electrode 106B. Simultaneously, a bit line electrode 108B is formed in correspondence to the conductive plug 106B. Thus, both of the capacitor upper electrode 108A and the bit line electrode 108B have the layered structure in which the polysilicon film 108a and the WSi film 108b are stacked. The electrode 108A form, together with the electrode 106A and the intervening $SiO_2$ film 107, the capacitor C of the analog circuit.

Next, in the step of FIG. 15D, another interlayer insulation film 109 of PSG, BPSG or HSG is deposited on the structure of FIG. 15C such that the interlayer insulation film 109 covers the upper electrode 108A and the bit line electrode 108B. Further, an opening 109A is formed in the interlayer insulation film 109 thus formed in correspondence to the amorphous silicon plug 106C by an RIE process. Further, an $SiO_2$ film is deposited on the interlayer insulation film 109 so as to cover the opening 109A, and an anisotropic etching process acting substantially perpendicularly to the principal surface of the substrate 101 is applied to the SiO$_2$ film thus deposited. Thereby, there is formed an SiO$_2$ side wall film 109B on the side wall of the opening 109A. Simultaneously, to the formation of the side wall oxide film 109B, there is formed a corresponding opening in the SiO$_2$ film 107 as a result of the RIE process, wherein opening thus formed exposes the conductive plug 106C.

Next, a storage electrode 110 of DRAM is formed on the interlayer insulation film 109 so as to cover the opening 109A by depositing an amorphous silicon layer or a polysilicon layer doped with P, and a capacitor dielectric film 111 of SiO$_2$ or SiN is formed on the surface of the storage electrode 110. Further, a cell plate electrode 112 is formed on the capacitor dielectric film 111.

According to the process of FIGS. 15A–15D, the lower electrode 106A is formed simultaneously to the process of forming the amorphous silicon plug 106B or 106C, and there is no need of extra mask process for patterning the lower electrode 106A. Further, the upper electrode 108A of the capacitor is formed simultaneously with the bit line electrode 108B and there is no extra mask process needed for patterning the upper electrode 108A. Thus, according to the present embodiment, it is possible to form an analog integrated circuit including a capacitor and a DRAM on a common substrate, simultaneously and without increasing the number of fabrication steps.

Ninth Embodiment

FIGS. 16A and 16B show the fabrication process of a semiconductor device 220 according to a ninth embodiment of the present invention, wherein those parts corresponding to the parts described previously are designated by the same reference numerals and the description thereof will be omitted. It should be noted that the semiconductor device 220 is a modification of the semiconductor device 200 described previously.

Referring to FIG. 16A, the opening 105A and the contact holes 105B and 105C are, after the step of FIG. 15B, filled by P-doped amorphous silicon plugs 106A–106C respectively. After applying a CMP process, the SiO$_2$ film 107 is deposited on the interlayer insulation film 105, and a P-doped amorphous silicon film 107B is deposited further on the SiO$_2$ film 107. In the step of FIG. 16A, the opening 107A penetrates through the SiO$_2$ film 107 and the amorphous silicon film 107B and exposes the amorphous silicon plug 106B. Thereby, the opening 107A functions as a bit line contact hole.

In the present embodiment, the structure of FIG. 16A is subjected to a wet etching process in an aqueous solution of HF, and the native oxide film is removed from the exposed surface of the amorphous silicon plug 106B. In this process, it should be noted the SiO$_2$ film 107 is effectively protected from the HF etchant by the P-doped amorphous silicon film 107B.

Next, in the step of FIG. 16B, the upper electrode 108A of the capacitor C and the bit line electrode 108B are formed on the structure of FIG. 16A similarly to the process of FIG. 15C.

According to the semiconductor device 220 of the present embodiment, it becomes possible to remove the native oxide film from the exposed surface of the amorphous silicon plug 106B in the step of FIG. 16A by applying an HF treatment, and the contact resistance of the bit line electrode 108B is reduced substantially. As the SiO$_2$ film 107 is protected by the amorphous silicon film 107B, such treatment by HF does not cause the problem of thinning of the capacitor insulation film in the analog integrated circuit.

After the step of FIG. 16B, the process similar to the process of FIG. 15D is conducted, and there is formed a semiconductor device in which an analog integrated circuit including a capacitor C and a DRAM are integrated monolithically on a common substrate.

Tenth Embodiment

FIGS. 17A–17C show the fabrication process of a semiconductor device 230 according to a tenth embodiment of the present invention, wherein those parts corresponding to the parts described previously are designated by the same reference numerals and the description thereof will be omitted. It should be noted that the semiconductor device 230 is a modification of the semiconductor device 220 described previously.

Referring to FIG. 17A, the opening 105A and the contact hole 105C are, after the step of FIG. 15B, filled by P-doped amorphous silicon plugs 106A and 106C respectively, and a CMP process is applied further thereto, similarly as before. In the present embodiment, on the other hand, the contact hole 105B corresponding to the bit line contact is not formed in the step of FIG. 17A.

Next, in the step of FIG. 17B, the SiO$_2$ film 107 is deposited on the structure of FIG. 17A, and the P-doped amorphous silicon film 107B is deposited further on the SiO$_2$ film 107. Further, the opening 107A is formed so as to penetrate through the foregoing films 107 and 107B, and the contact hole 105B is formed in the interlayer insulation film 105.

Further, in the step of FIG. 17C, the polysilicon film 108a doped with P is deposited so as to cover the contact hole 105B, and the WSi film 108b is deposited further thereon. By conducting a patterning process on the films 108a and 108b, the upper electrode 108A of the capacitor C is formed in correspondence to the lower electrode 106A of the capacitor C. Further, the bit line electrode 108B is formed so as to cover the contact hole 105B simultaneously to the upper electrode 108A.

In the present embodiment, too, the lower electrode 106A is formed concurrently with the conductive plug 106C. Further, the upper electrode 108A is formed simultaneously with the conductive plug 108B forming the bit line. Thereby, it is not necessary to provide any excessive deposition process or mask process.

Eleventh Embodiment

FIGS. 18A–18G show the fabrication process of a semiconductor device 240 according to an eleventh embodiment of the present invention.

Figures 18A, 18B:
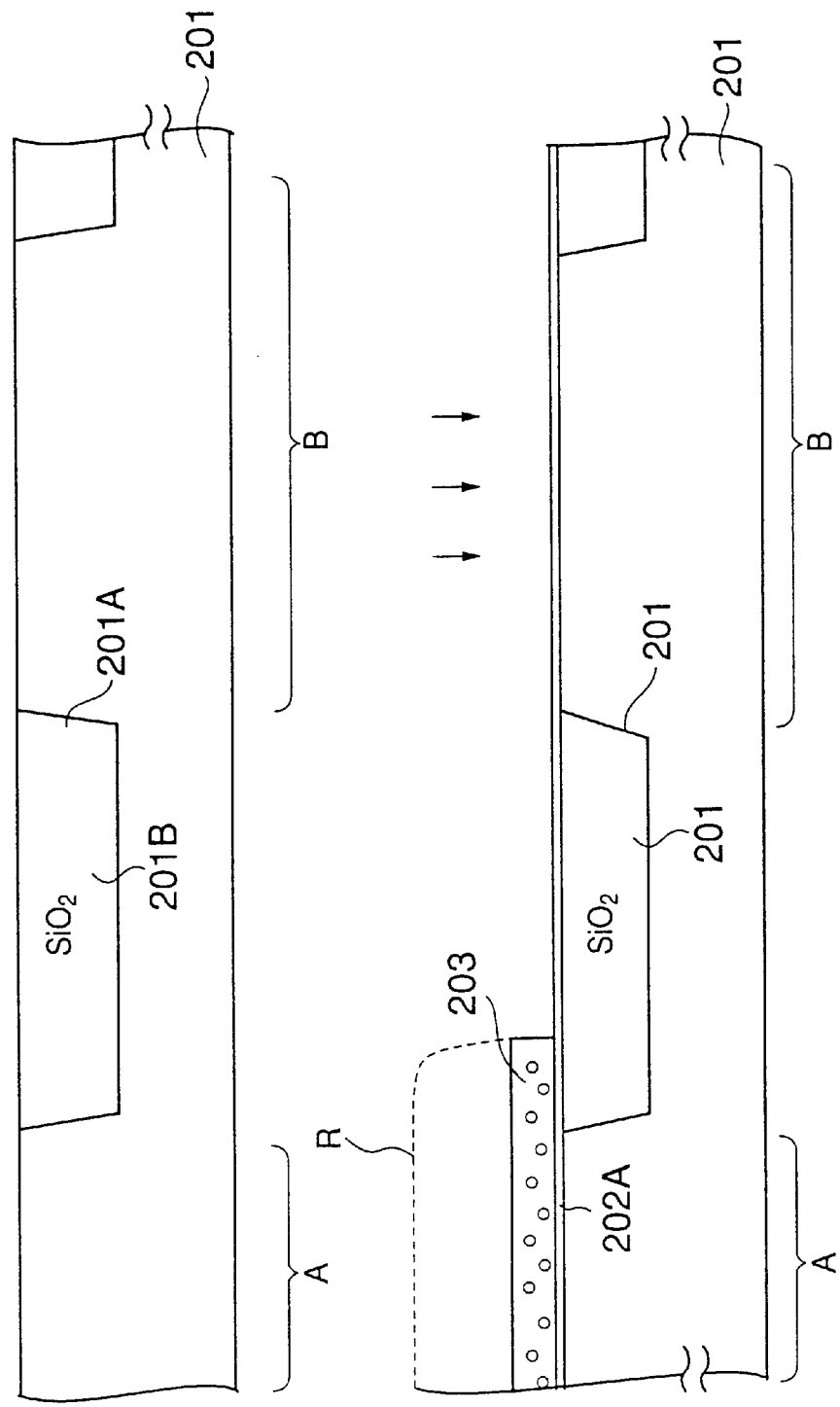
FIGS. 18A–18G are diagrams showing the construction of a semiconductor device according to an eleventh embodiment of the present invention.

Referring to FIG. 18A, the semiconductor device 240 is formed on a p-type substrate 201 wherein there is formed a device isolation trench 201A on the surface of the substrate 201 between an analog circuit region A and a DRAM circuit region B, and the device isolation trench 201A is filled with an SiO$_2$ film 201B. In the process of FIG. 18A, there is formed an n-type well (not shown) in the analog circuit region A by conducting thereto an ion implantation process of an n-type impurity such as As.

Next, in the step of FIG. 18B, there is formed a thermal oxide film 202A on the structure of FIG. 18A uniformly as a result of a thermal oxidation process of the Si substrate 201, wherein the thermal oxide film 202A thus formed serves for a gate oxide film of the MOSFETs that are formed on the analog circuit region A. Further, the gate oxide film 202A is covered with a polysilicon film with a thickness of 100–200 nm. By patterning the polysilicon film thus deposited by a dry etching process that uses a mixture of $Cl_2$ and $O_2$ as an etching gas while using a resist pattern R as a mask, there is formed a polysilicon pattern 203 on the gate oxide film 202A in the analog circuit region A. Further, by conducting an ion implantation process of an impurity element such as B into the substrate while using the resist pattern R and the polysilicon pattern 203 as a mask, there is formed a p-type well (not shown) in the substrate 201 in correspondence to the DRAM region B.

Figures 18C, 18D:
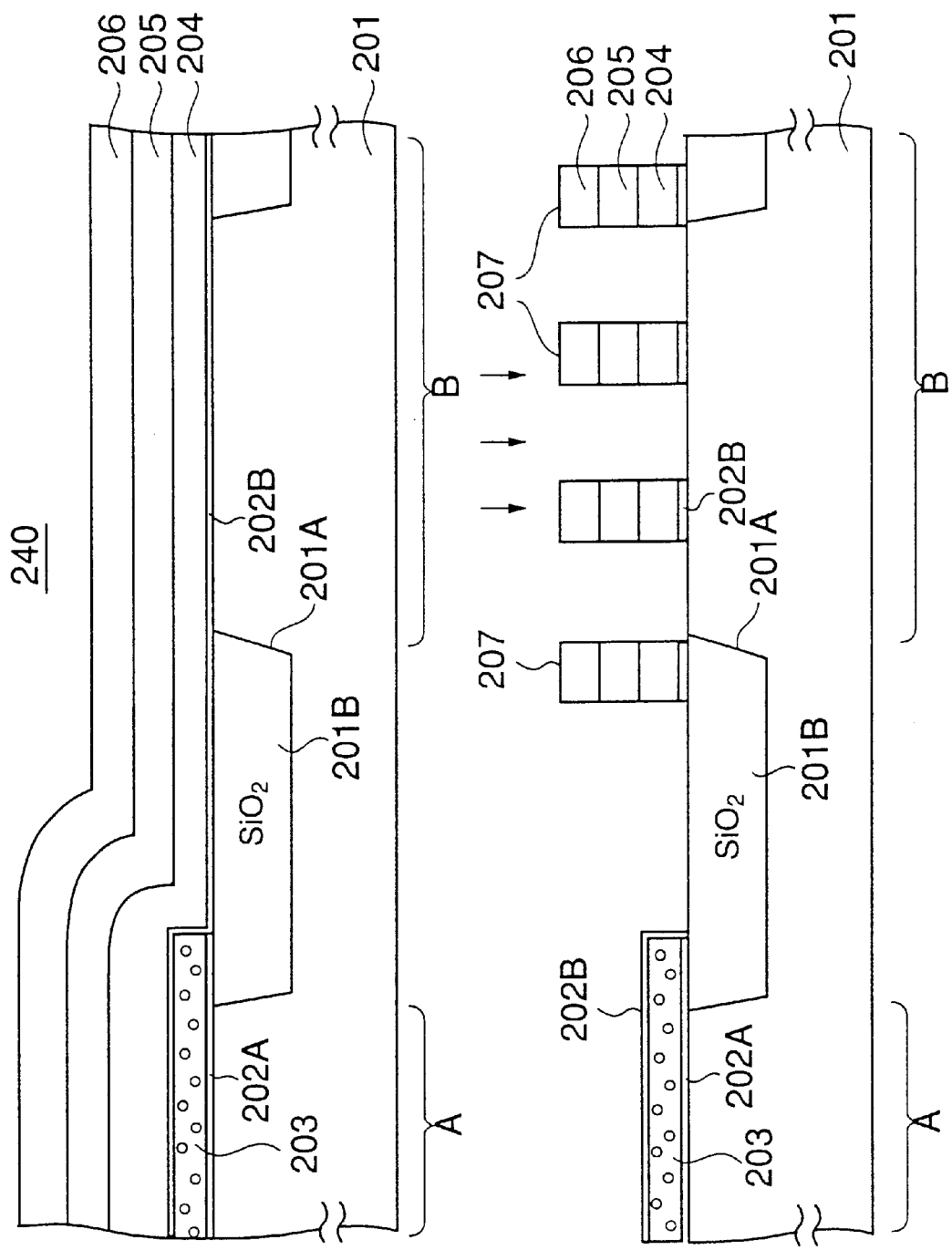

Next, in the step of FIG. 18C, the thermal oxide film 202A exposed at the surface of the Si substrate 201 is removed by a wet etching process using HF as an etchant, and an $SiO_2$ film 202B is newly formed on the surface 201 of the Si substrate 201 by a thermal oxidation process. As a result of the thermal oxidation process, there is formed also a thermal oxide film on the surface of the polysilicon pattern 203 in continuation with the $SiO_2$ film 202B.

Next, in the step of FIG. 18C, the $SiO_2$ film 202B is covered consecutively by a P-doped amorphous silicon film 204, a W film 205 and an $SiO_2$ film 206 respectively with the thicknesses of 70 nm, 100 nm and 100 nm. By applying a patterning process consecutively, there are formed a plurality of gate electrodes 207 in the DRAM region B. Thereby, it should be noted that the patterning of the $SiO_2$ film 206 is conducted by an RIE process using a mixture of $CF_4$, $CHF_3$ and Ar as an etching gas, while the patterning of the W film 205 and the amorphous silicon film 204 is conducted by an RIE process using a mixture of $Cl_2$ and $O_2$ as an etching gas.

Further, in the step of FIG. 18D, an ion implantation process of P or As is conducted into the substrate 201 in the DRAM region B to form n-type diffusion regions adjacent to each of the gate electrodes 207.

Figure 18E:
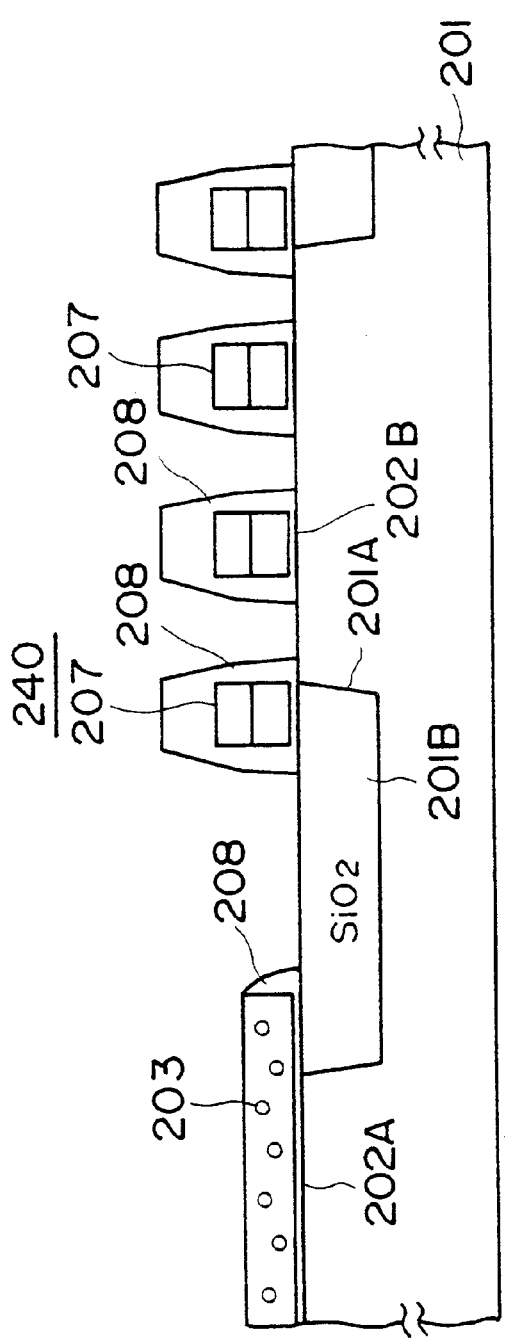

Next, in the step of FIG. 18E, an $SiO_2$ film is deposited uniformly on the structure of FIG. 18D, and the $SiO_2$ film thus formed is subjected to an etch-back process acting generally perpendicularly to the principal surface of the substrate 201, to form an oxide pattern 208 covering the top surface and the side walls of the gate electrode 207. Further, the oxide pattern 208 is formed also on the side wall of the polysilicon pattern 203. Thereby, the oxide patterns 208 on the gate electrodes 207 define therebetween a self-aligned contact hole exposing the surface of the substrate 201.

Figure 18F:
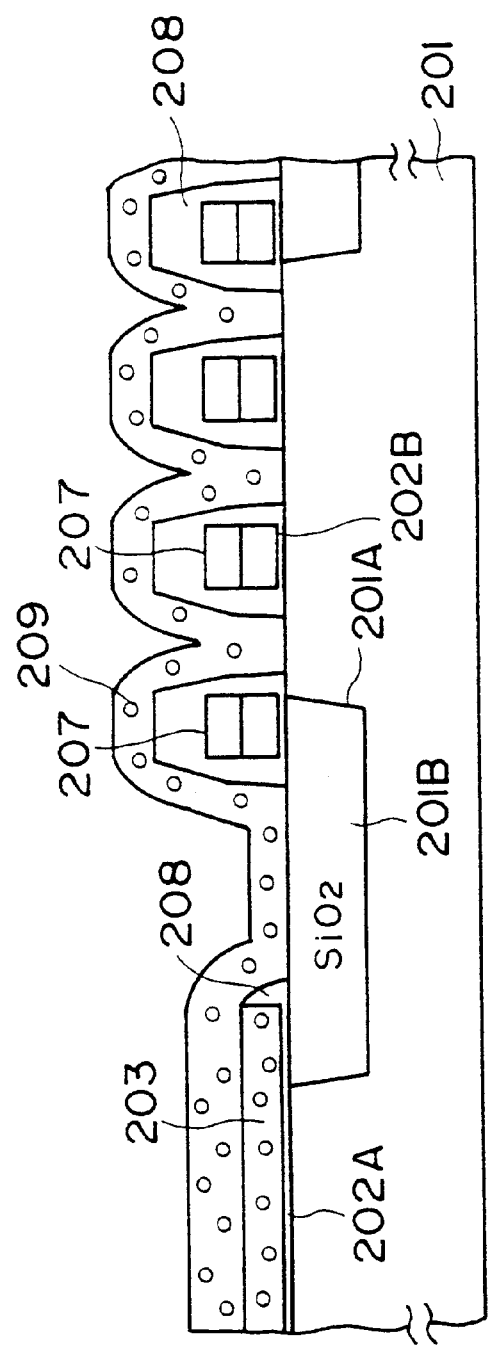
Figure 18G:
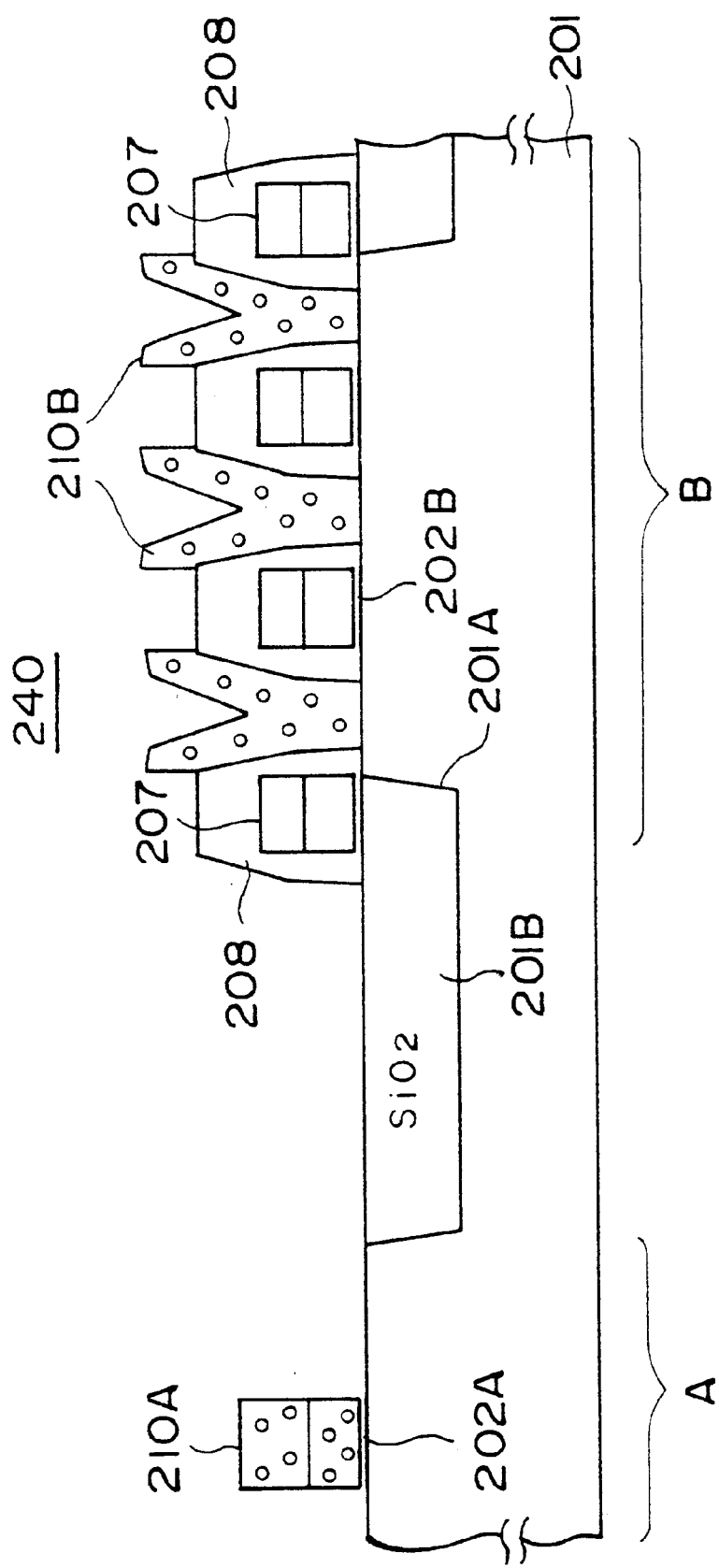

Next, in the step of FIG. 18F, there is formed a polysilicon film 209 uniformly on the structure of FIG. 18E so as to cover the self-aligned contact holes, and the polysilicon film 209 thus formed is subjected to a patterning process in the step of FIG. 18G such that the patterning process is conducted by an RIE process that uses a mixture of $Cl_2$ and $O_2$ as an etching gas. Thereby, there is formed a conductive plug 210B in the self-aligned contact holes in the DRAM region B of the substrate 201 in electrical contact with the diffusion regions formed thereon. In the analog circuit region A, on the other hand, there is formed a gate electrode 210 as a result of the patterning of the polysilicon film 209.

In the semiconductor device 240 of FIG. 18G, the conductive plugs 210B are formed in the DRAM region B so as to fill the miniaturized self-aligned contact holes without the need of additional mask processes. Further, the formation of the conductive plugs 210B is made simultaneously with the formation of the gate electrode in the analog circuit region A. By forming the conductive plug 210B, the need of forming a deep contact hole in the interlayer insulation film covering the structure of FIG. 18G is eliminated, and the fabrication of the semiconductor device is facilitated substantially.

Twelfth Embodiment

FIGS. 19A–19C show the fabrication process of a semiconductor device 250 according to a twelfth embodiment of the present invention, wherein those parts corresponding to the parts described previously are designated by the same reference numerals and the description thereof will be omitted.

In the present embodiment, the structure of FIG. 18E is covered by an $SiO_2$ film by conducting a CVD process. By applying an etch-back process to the $SiO_2$ film thus formed, there is formed an $SiO_2$ film 211A covering the polysilicon pattern 203. It should be noted that the $SiO_2$ film 211A covers the $SiO_2$ side wall film 208 covering the side wall of the polysilicon pattern 203. As a result of the patterning of the CVD-$SiO_2$ film noted above, there is formed a side wall film 211B on the side wall of the $SiO_2$ film 208 covering the gate electrode 207.

In the example of FIG. 19A, it should be noted that the shallow trench structure 201B in the substrate 201 is replaced with an n-type well 201C.

Next, in the step of FIG. 19B, an amorphous silicon film 212 doped with P is deposited on the structure of FIG. 19A typically with a thickness of 100–200 nm. Further, the amorphous silicon film 212 is patterned in the step of FIG. 19C, and there is formed an amorphous silicon pattern 212A in correspondence to the polysilicon pattern 203. Simultaneously, there is formed a conductive plug 212B between a pair of adjacent gate electrodes 207 so that the conductive plug 212B makes a contact with the surface of the Si substrate 201. Here, the amorphous silicon pattern 212A forms, in the analog circuit region A, the capacitor C together with the $SiO_2$ film 211A and the polysilicon pattern 203. Further, the conductive plug 212B constitutes an interconnection electrode similar to the conductive plug 210B of FIG. 18G.

Thirteenth Embodiment

FIGS. 20A–20D show the fabrication process of a semiconductor device 260 according to a thirteenth embodiment of the present invention, wherein those parts corresponding to the parts described previously are designated by the same reference numerals and the description thereof will be omitted.

Figure 20A:
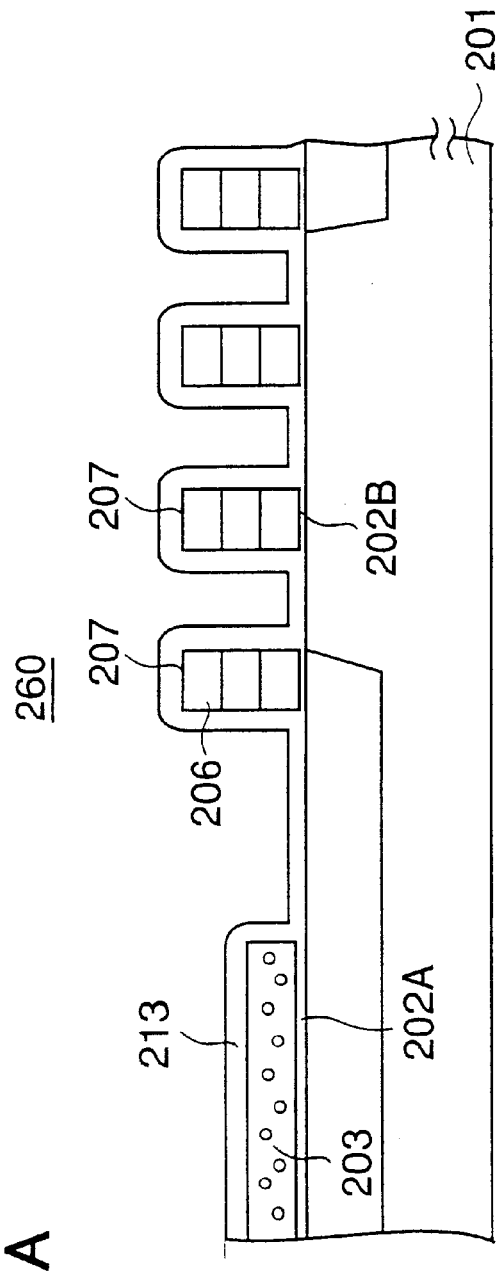
Figure 20B:
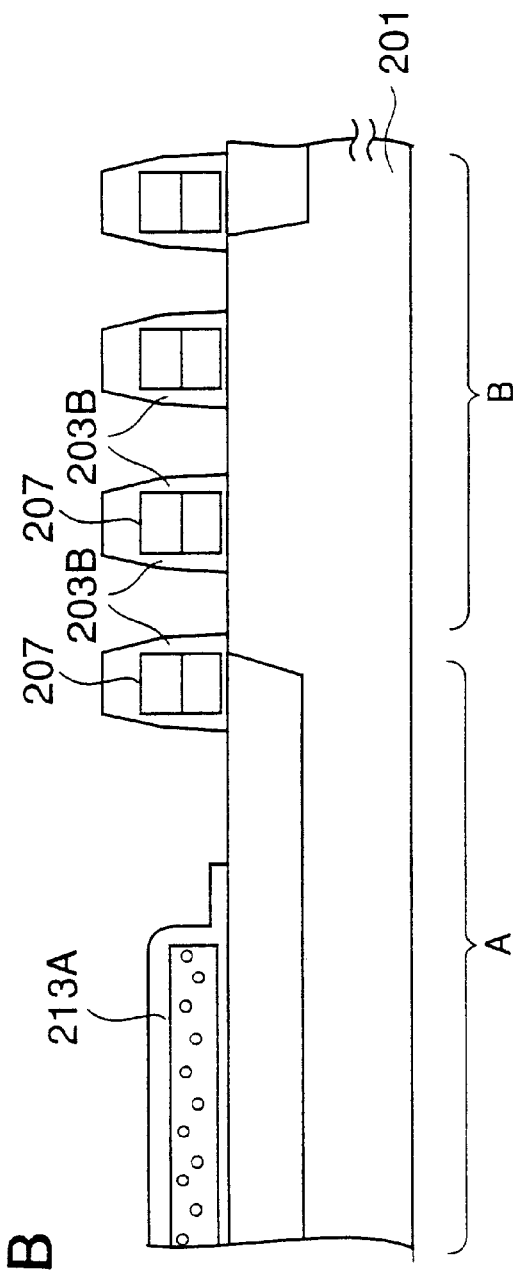

Referring to FIG. 20A, an $SiO_2$ film 213 is deposited on the structure of FIG. 18D by a CVD process with a thickness of 30–50 nm, wherein the $SiO_2$ film 213 thus formed is subjected to an etch-back process in the step of FIG. 20B, and an $SiO_2$ film 213A covering the polysilicon pattern 203 and an $SiO_2$ film 213B covering the gate electrode 207 are formed simultaneously. During this etch-back process, the $SiO_2$ film 213 is protected by a resist pattern (not shown) in correspondence to the analog circuit region. In the step of FIG. 20A, it should be noted that the shallow trench structure 201B of FIG. 18D is replaced with the n-type well 201C. Further, the $SiO_2$ film constituting the top part of the gate electrode 207 is indicated in FIG. 20B as a part of the $SiO_2$ film 213B.

Further, in the step of FIG. 20C, an amorphous silicon film 214 doped with P is deposited on the structure of FIG. 20B with a thickness of 100–200 nm. By patterning the amorphous silicon film 214 thus deposited, there is formed an upper electrode 214A of the capacitor C and the conductive plug 214B of the DRAM.

Fourteenth Embodiment

Figure 21:
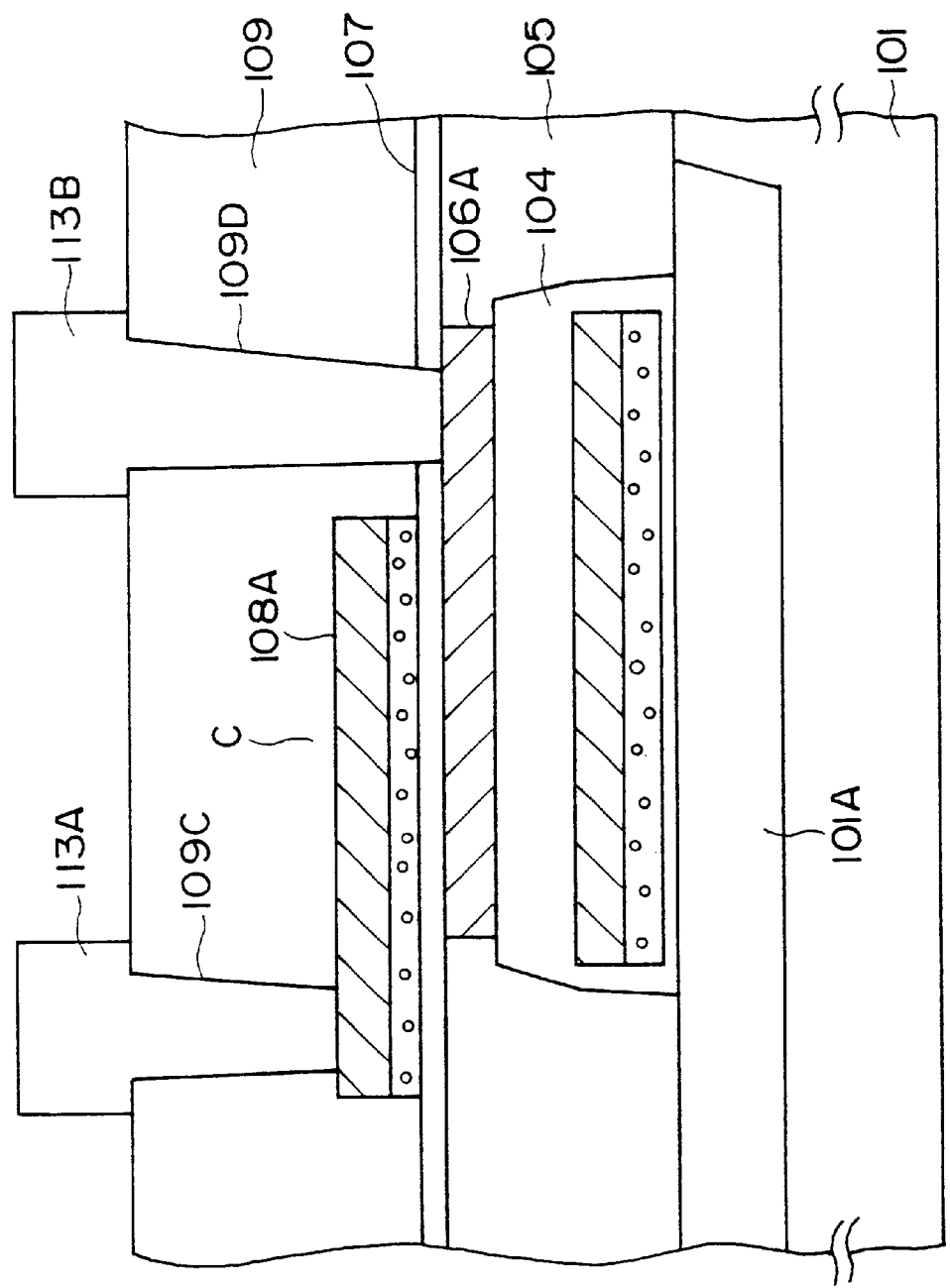
FIG. 21 is a diagram showing the construction of a semiconductor device according to a fourteenth embodiment of the present invention.

FIG. 21 shows the construction according to a fourteenth embodiment of the present invention, wherein the construction of FIG. 21 is used in the semiconductor device 200 of FIG. 15D for making an electrical contact with the capacitor C formed in the analog circuit region. In FIG. 21, those parts corresponding to the parts described previously are designated by the same reference numerals and the description thereof will be omitted.

Referring to FIG. 21, there is formed a contact hole 109C in the upper interlayer insulation film 109 so as to expose the upper electrode 108A of the capacitor C, and an electrode 113A is formed on the interlayer insulation film 109 so as to fill the contact hole 109C. Further, another contact hole 109D is formed in the interlayer insulation film 109 so as to penetrate through the $SiO_2$ film 107 and expose the lower electrode 106A. Further, an electrode 113B is formed on the interlayer insulation film 109 so as to cover the contact hole 109D.

Fifteenth Embodiment

Figure 22:
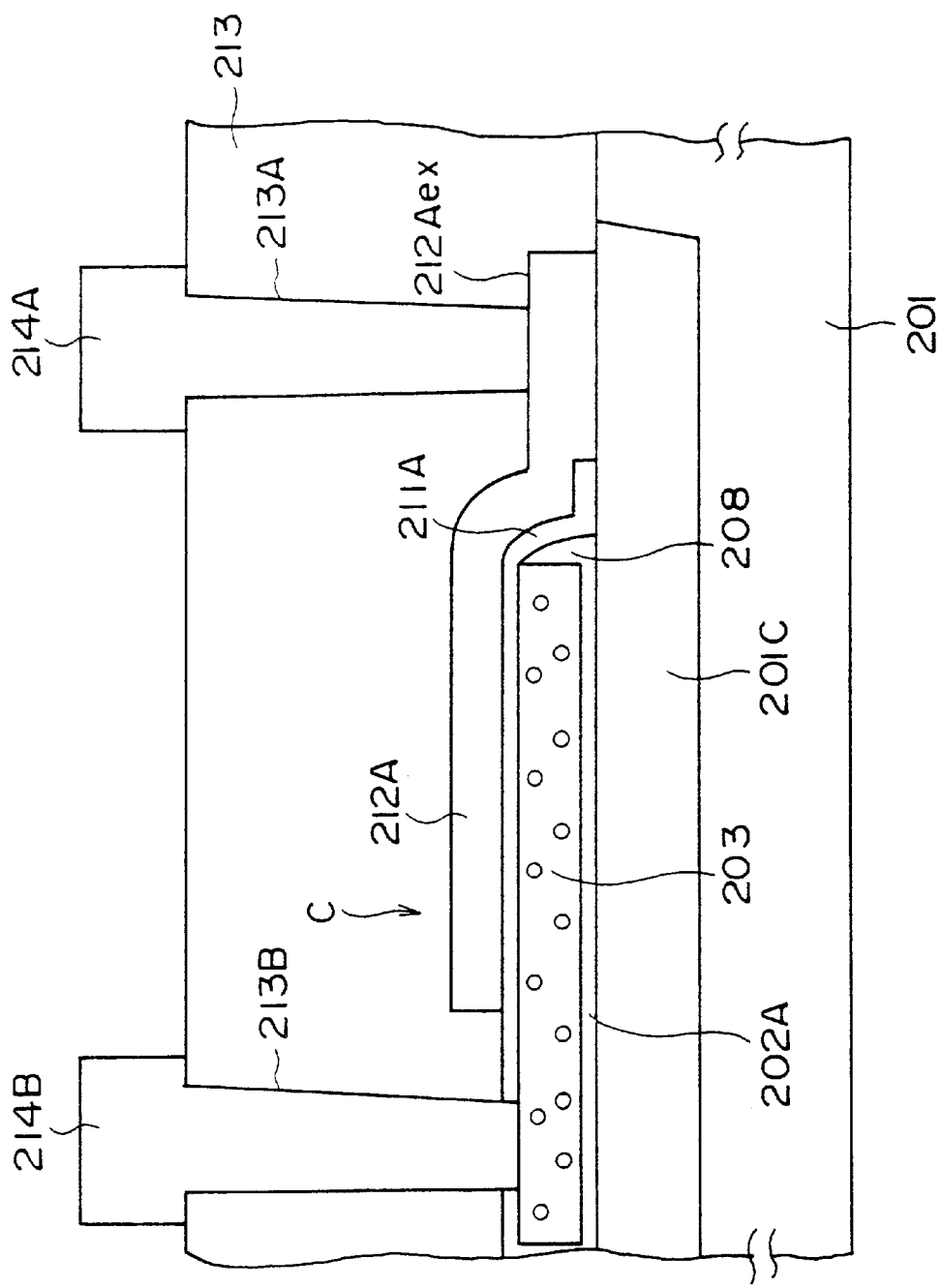
FIG. 22 is a diagram showing the construction of a semiconductor device according to a fifteenth embodiment of the present invention.

FIG. 22 shows the construction according to a fifteenth embodiment of the present invention, wherein the construction of FIG. 22 is used in the semiconductor device 250 of FIG. 19C for making an electrical contact with the capacitor C formed in the analog circuit region A. In FIG. 22, those parts corresponding to the parts described previously are designated by the same reference numerals and the description thereof will be omitted.

Referring to FIG. 22, a part of the upper electrode 212A extends outside the capacitor C to form an extension part 212A*ex*, and the interlayer insulation film 213 is formed so as to cover the capacitor C. The interlayer insulation film 213 is formed with a contact hole 213A exposing the foregoing extension part 212A*ex*, and there is formed an electrode 214A so as to fill the contact hole 213A on the interlayer insulation film 213. Further, the interlayer insulation film 213 is formed with a contact hole 213B exposing the lower electrode 203 of the capacitor C, and an electrode 214B is formed on the interlayer insulation film 213 in electrical contact with the lower electrode 203 via the contact hole 213B.

In the description heretofore, the explanation of the invention was made with regard to the embodiments that use a field oxide film for the device isolation. However, the present invention is by no means limited to these specific embodiments but is applicable also to the device that uses a shallow trench isolation for the device isolation structure.

Further, it is not necessary for the contact holes to expose the substrate but the contact holes may make an electrical contact with a corresponding diffusion region via a conductive plug formed in the contact hole.

Further, the present invention is not limited to the embodiments described heretofore, but various variations and modifications may be made without departing from the scope of the invention.

The present application is based on Japanese priority applications No.10-292516 filed Oct. 14, 1998 and No.11-42291 filed Feb. 19, 1999, the entire contents of which are hereby incorporated by reference.

What is claimed is:

1. A semiconductor device, comprising:
a substrate including a first region and a second region;
an interlayer insulation film formed over said substrate so as to cover said first and second regions; and
a capacitor formed over said interlayer insulation film in said first region;
wherein said interlayer insulation film includes a groove having a bottom surface lower in level than a surface of said interlayer insulation film in said first region and said second region;
said capacitor making a contact with said interlayer insulation film,
said groove being formed at a boundary between said first and second regions and filled with an insulation layer.

2. A semiconductor device as claimed in claim 1, wherein said interlayer insulation film includes a contact hole electrically connected to said substrate in said first region, said capacitor including a first electrode formed via said contact hole, a dielectric film covering said first electrode and a second electrode covering said dielectric film, said contact hole having a side wall covered by a side wall insulation film, said interlayer insulation film carrying, in said part thereof covering said second region, an insulation film having a composition substantially identical with a composition of said side wall insulation film.

3. A semiconductor device as claimed in claim 1, wherein said stepped part is covered by a conductor pattern.

4. A semiconductor device as claimed in claim 1, wherein said capacitor forms, together with other capacitors that have a construction identical with a construction of said capacitor, a capacitor array; said interlayer insulation film including a contact hole, in said first region outside a region of said capacitor array, such that said contact hole exposes a device isolation structure formed on said substrate, said contact hole that exposes said device isolation structure has a dummy capacitor having a construction identical with said construction of said capacitor.

5. A semiconductor device as claimed in claim 1, wherein said electrode pattern constitutes a part of another capacitor.

6. A semiconductor device as claimed in claim 1, wherein the interlayer insulation film comprises a single layer in which the groove is formed.

7. A semiconductor device, comprising:
a substrate having a diffusion region;
an interlayer insulation film formed over said substrate;
a first contact hole formed in said interlayer insulation film so as to expose said diffusion region;
a side wall oxide film covering a side wall of said first contact hole;
an electrode pattern formed over said interlayer insulation film so as to cover said first contact hole in such a state that said side wall oxide film is interposed between said electrode pattern and said side wall of said first contact hole;
a first capacitor electrode formed over said substrate so as to be covered by said interlayer insulation film;
a second contact hole formed in said interlayer insulation film so as to expose said first capacitor electrode;
a capacitor insulation film formed over said interlayer insulation film so as to cover said second contact hole in conformity with a shape of said second contact hole, said capacitor insulation film having a composition substantially identical with a composition of said side wall oxide film; and
a second capacitor electrode formed over said capacitor insulation film so as to cover said second contact hole via said capacitor insulation film, said first capacitor electrode, said second capacitor electrode and said capacitor insulation film forming together a capacitor.

8. A semiconductor device as claimed in claim 7, wherein said electrode pattern and said second capacitor electrode have a substantially identical composition and a substantially identical thickness.

9. A semiconductor device as claimed in claim 7, wherein said substrate further includes a device isolation film and a gate electrode, said first capacitor electrode being formed of a conductor pattern formed over said device isolation film, said conductor pattern having a composition and a thickness substantially identical with a composition and a thickness of said gate electrode.

10. A semiconductor device as claimed in claim 7, wherein said first capacitor electrode is formed of another diffusion region formed in said subtracted.

11. A semiconductor device, comprising:
a substrate defined with a memory cell region and a peripheral region;
a memory cell transistor formed on said memory cell region of said substrate, said memory cell transistor constituting a memory cell;
a first interlayer insulation film formed over said substrate so as to cover said memory cell region and said peripheral region continuously;
a second interlayer insulation film formed over said first interlayer insulation film so as to cover said memory cell region and said peripheral region continuously;
a first contact hole formed in a part of said first interlayer insulation film covering said memory cell region, said first contact hole providing an electrical connection to a first diffusion region of said memory cell transistor;
a first side wall insulation film covering a side wall of said first contact hole;
a first electrode formed over a part of said first interlayer insulation film covering said memory cell region such that said first electrode covers said first contact hole via said first side wall insulation film, said first electrode being covered by said second interlayer insulation film and making an electrical contact with said first diffusion region;
a second contact hole formed over a part of said second interlayer insulation film covering said memory cell region so as to penetrate through said first interlayer insulation film, said second contact hole providing an electrical connection to a second diffusion region of said memory cell transistor;
a second side wall insulation film covering a side wall of said second contact hole;
a second electrode formed over a part of said second interlayer insulation film covering said memory cell region so as to cover said second contact hole, said second electrode making an electrical contact with said second diffusion region and constituting an accumulation electrode of a memory cell capacitor;
a capacitor dielectric film covering said second electrode;
an opposing electrode of said memory cell capacitor covering said second electrode via said capacitor insulation film;
a device isolation film formed over said substrate in correspondence to said peripheral circuit region;
a lower capacitor electrode formed over said device isolation region, said lower capacitor electrode being covered by said first interlayer insulation film;
a third contact hole formed in a part of said first interlayer insulation film covering said lower capacitor electrode so as to expose said lower capacitor electrode;
a capacitor insulation film formed over a part of said first interlayer insulation film covering said peripheral region so as to cover said third contact hole, said capacitor insulation film forming a depression in conformity in shape with a shape of said third contact hole; and
a third electrode formed over said capacitor insulation film so as to cover said depression thereof, said third electrode constituting an upper capacitor electrode;
said second interlayer insulation film including, in said memory cell region, a step defined by a groove having a bottom surface at a level lower than a level of a surface of said second interlayer insulation film in said peripheral region, said groove extending along a boundary between said memory cell region and said peripheral region;
said lower capacitor electrode having a composition and a thickness substantially identical with those of a gate electrode of said memory cell transistor;
said capacitor insulation film having a composition substantially identical with a composition of said first side wall insulation film,
said third electrode having a composition and a thickness substantially identical with those of said first electrode.

12. A semiconductor device as claimed in claim 11, wherein said stepped part is covered by a conductor pattern.

13. A semiconductor device as claimed in claim 11, wherein said memory cell capacitor forming, together with other memory cell capacitors having a construction substantially identical with a construction of said memory cell capacitor, a capacitor array in said memory cell region, said first and second insulation films being formed with a contact hole exposing a field insulation film formed on said substrate at a part outside said capacitor array, said contact hole exposing said field insulation film is formed with a dummy capacitor having a construction substantially identical with said memory cell capacitor.

14. A semiconductor device, comprising:
a substrate defined with a memory cell region and a peripheral region;
a memory cell transistor formed on said memory cell region of said substrate, said memory cell transistor constituting a memory cell;
a first interlayer insulation film formed over said substrate so as to cover said memory cell region and said peripheral region continuously;
a second interlayer insulation film formed over said first interlayer insulation film so as to cover said memory cell region and said peripheral region continuously;
a first contact hole formed in a part of said first interlayer insulation film covering said memory cell region, said first contact hole providing an electrical connection to a first diffusion region of said memory cell transistor;
a first side wall insulation film covering a side wall of said first contact hole;
a first electrode formed over a part of said first interlayer insulation film covering said memory cell region so as to cover said first contact hole, said first electrode being covered by said second interlayer insulation film and making an electrical contact with said first diffusion region;
a second contact hole formed over a part of said second interlayer insulation film covering said memory cell region, said second contact hole providing an electrical connection to a second diffusion region of said memory cell transistor;
a second side wall insulation film covering a side wall of said second contact hole;

a second electrode formed over a part of said second interlayer insulation film covering said memory cell region so as to cover said second contact hole, said second electrode making an electrical connection with said second diffusion region and constituting an accumulation electrode of a memory cell capacitor;

a capacitor dielectric film covering said second electrode;

an opposing electrode of said memory cell capacitor covering said second electrode via said capacitor dielectric film;

a device isolation film formed over said substrate in correspondence to said peripheral region;

a lower capacitor electrode formed over said device isolation film, said lower capacitor electrode being covered by said first and second interlayer insulation films;

a third contact hole formed in a part of said first and second interlayer insulation films covering said peripheral region so as to expose said lower capacitor electrode;

a capacitor insulation film formed in a part of said second interlayer insulation film covering said peripheral region so as to cover said third contact hole, said capacitor insulation film forming a depression in conformity with a shape of said third contact hole; and a third electrode formed over said capacitor insulation film so as to cover said depression, said third electrode constituting an upper capacitor electrode;

said second interlayer insulation film including, in said memory cell region, a stepped part defined by a groove having a bottom surface lower in level than a top surface of said second interlayer insulation film in said peripheral region, said groove extending along a boundary between said memory cell region and said peripheral region;

said lower capacitor electrode having a composition and a thickness substantially identical with those of a gate electrode of said memory cell transistor;

said capacitor insulation film having a composition substantially identical with a composition of said first side wall insulation film;

said third electrode having a composition and a thickness substantially identical with those of said second electrode.

15. A semiconductor device as claimed in claim 14, wherein said stepped part is covered by a conductor pattern.

16. A semiconductor device as claimed in claim 14, wherein said memory cell capacitor forming, together with other memory cell capacitors having a construction substantially identical with a construction of said memory cell capacitor, a capacitor array in said memory cell region, said first and second insulation films being formed with a contact hole exposing a field insulation film formed on said substrate at a part outside said capacitor array, said contact hole exposing said field insulation film is formed with a dummy capacitor having a construction substantially identical with said memory cell capacitor.

17. A semiconductor device, comprising:

a substrate defined with a memory cell region and a peripheral region;

a memory cell transistor formed in said memory cell region of said substrate, said memory cell transistor constituting a memory cell;

a first interlayer insulation film formed over said substrate so as to cover said memory cell region and said peripheral region continuously;

a second interlayer insulation film formed over said first interlayer insulation film so as to cover said memory cell region and said peripheral region continuously;

a first contact hole formed in a part of said first interlayer insulation film covering said memory cell region, said first contact hole providing an electrical connection to a first diffusion region of said memory cell transistor;

a first side wall insulation film covering a side wall of said first contact hole;

a first electrode formed over a part of said interlayer insulation film covering said memory cell region so as to cover said first contact hole, said first electrode being covered by said second interlayer insulation film and making an electrical connection with said first diffusion region;

a second contact hole formed in a part of said second interlayer insulation film, said second contact hole providing an electrical connection to a second diffusion region of said memory cell transistor;

a second side wall insulation film covering a side wall of said second contact hole;

a second electrode formed over a part of said second interlayer insulation film covering said memory cell region so as to cover said second contact hole, said second electrode making an electrical contact with said second diffusion region and constituting an accumulation electrode of a memory cell capacitor;

a capacitor dielectric film covering said second electrode;

an opposing electrode of said memory cell capacitor covering said second electrode via said capacitor dielectric film;

a third diffusion region formed in said peripheral region of said substrate, said third diffusion region being covered by said first and second interlayer insulation films;

a third contact hole formed in a part of said first and second interlayer insulation films covering said peripheral region, said third contact hole providing an electrical contact with said third diffusion region;

a capacitor insulation film formed over a part of said second interlayer insulation film covering said peripheral region so as to cover said third contact hole, said capacitor insulation film forming a depression in conformity with a shape of said third contact hole; and a third electrode formed over said capacitor insulation film so as to cover said depression, said third electrode constituting an upper capacitor electrode;

said second interlayer insulation region including, in said memory cell region, a stepped part defined by a groove having a bottom surface at a level lower than a level of a surface of said second interlayer insulation film in said peripheral region, said groove extending along a boundary between said memory cell region and said peripheral region;

said lower capacitor electrode having a composition and a thickness substantially identical with those of a gate electrode of said memory cell transistor;

said capacitor electrode having a composition substantially identical with a composition of said first side wall insulation film;

said third electrode having a composition and a thickness substantially identical with those of said second electrode.

18. A semiconductor device as claimed in claim 17, wherein said stepped part is covered by a conductor pattern.

19. A semiconductor device as claimed in claim 17, wherein said memory cell capacitor forming, together with other memory cell capacitors having a construction substantially identical with a construction of said memory cell capacitor, a capacitor array in said memory cell region, said first and second insulation films being formed with a contact hole exposing a field insulation film formed on said substrate at a part outside said capacitor array, said contact hole exposing said field insulation film is formed with a dummy capacitor having a construction substantially identical with said memory cell capacitor.

20. A semiconductor device, comprising:
a substrate;
a first conductive layer formed over said substrate;
an interlayer insulation film formed over said substrate so as to cover said first conductive layer;
a contact hole formed in said interlayer insulation film so as to expose said substrate;
a side wall insulation film covering a side wall of said contact hole;
a conductive side wall film covering aside wall of said side wall insulation film; and
a second conductive layer covering said conductive side wall film in said contact hole, said second conductive layer making an electrical contact with a surface of said substrate,
said conductive side wall film having a sleeve form conformal to said side wall of said contact hole.

21. A semiconductor device as claimed in claim 20, wherein said interlayer insulation film includes an opening exposing said first conductive layer, said opening having a side wall and a bottom surface covered by an insulation film having a composition substantially identical with a composition of said side wall insulation film, said insulation film being covered with a conductive film having a composition substantially identical with a composition of said conductive side wall film, said conductive film further carrying thereon an electrode having a composition substantially identical with a composition of said second conductive film.

22. A semiconductor device as claimed in claim 20, wherein said conductive side wall film is formed of polysilicon doped with an impurity element to a first concentration level, said second conductive layer being formed of a stacking of a polysilicon layer doped with said impurity element to a second, higher concentration level and a W layer.

23. A semiconductor integrated circuit, comprising:
a substrate;
a first semiconductor device formed on a first region of said substrate;
a second semiconductor device formed on a second region of said substrate;
an interlayer insulation film formed over said substrate;
a first opening formed in a part of said interlayer insulation film covering said first region;
a first electrode covering said first opening;
a second opening formed in a part of said interlayer insulation film covering said second region;
a second electrode covering said second opening;
an insulation film covering said interlayer insulation film; and
a third electrode formed over said insulation film in correspondence to said first electrode so as to sandwich said insulation film between said first electrode and said third electrode;
said first electrode filling said first opening but limited to inside of said first opening;
said second electrode filling said second opening but limited to inside of said second opening.

24. A semiconductor integrated circuit as claimed in claim 23, wherein said insulation film includes therein a contact hole exposing said second electrode, said insulation film further carrying thereon a fourth electrode in contact with said second electrode at said contact hole, said fourth electrode having a composition substantially identical with a composition of said third electrode.

25. A semiconductor integrated circuit as claimed in claim 24, wherein each of said third and fourth electrodes is formed of a first part and a second part formed thereon, said first part of said third electrode having a composition substantially identical with a composition of said first part of said fourth electrode, said second part of said third electrode having a composition substantially identical with a composition of said second part of said fourth electrode.

26. A semiconductor integrated circuit, comprising:
a substrate;
a first semiconductor device formed on a first region of said substrate;
a second semiconductor device formed on a second region of said substrate;
a first electrode formed over said first region of said substrate;
a first insulation film covering said first electrode;
a plurality of second electrodes formed in said second region of said substrate, each of said second electrodes comprising a side wall covered by a second insulation film, a pair of said plurality of second electrodes thereby forming a self-aligned contact hole therebetween;
a third electrode formed over said first insulation film so as to sandwich said first insulation film between said first electrode and said third electrode to form an analog capacitor device constituting a circuit element; and
a fourth electrode covering said self-aligned contact hole;
said third electrode and said fourth electrode having a substantially identical composition.

27. A semiconductor integrated circuit as claimed in claim 26, further comprising: a third insulation film covering a side wall of said first electrode; and a fourth insulation film interposed between said second electrode and said second insulation film thereon, said fourth insulation film covering a side wall and a top surface of said second electrode, said third insulation film and said fourth insulation film having a substantially identical composition.

28. A semiconductor integrated circuit as claimed in claim 26, wherein said first region includes an analog circuit as said first semiconductor device, and wherein said second region includes a DRAM as a second semiconductor device.

29. A semiconductor integrated circuit, comprising:
a substrate;
a first semiconductor device formed on a first region of said substrate;
a second semiconductor device formed on a second region of said substrate;
a first gate electrode formed over said first region of said substrate;
a plurality of second gate electrodes formed over said second region of said substrate, each of said second gate electrodes comprising a side wall covered by a second insulation film, a pair of said plurality of second gate electrodes forming a self-aligned contact hole therebetween;

an interconnection electrode covering said self-aligned contact hole;

said first gate electrode and said second gate electrode having different compositions.

30. A semiconductor integrated circuit as claimed in claim 24, wherein said first gate electrode includes a first part and a second part on said first part, said second part having a composition substantially identical with a composition of said interconnection electrode.

31. A semiconductor integrated circuit, comprising:

a substrate;

a first semiconductor device formed on a first region of said substrate;

a second semiconductor device formed on a second region of said substrate;

an interlayer insulation film formed over said substrate;

a first opening formed in a part of said interlayer insulation film covering said first region;

a first electrode covering said first opening;

a second opening formed in a part of said interlayer insulation film covering said second region;

a second electrode covering said second opening;

an insulation film covering said interlayer insulation film; and a third electrode formed over said insulation film in correspondence to said first electrode so as to sandwich said insulation film between said first electrode and said third electrode;

said first electrode and said second electrode having respective top surfaces located at an identical level as measured from a surface of said substrate, said second electrode acting as an interconnection element connecting said second semiconductor device to a conductor provided on said insulation film.

32. A semiconductor device as claimed in claim 31, wherein said respective top surfaces of said first electrode and said second electrode form a flush surface with a top surface of said interlayer insulation film, said flush surface being formed by a damascene process.

* * * * *